(12) United States Patent
Generazio

(10) Patent No.: US 11,293,964 B2
(45) Date of Patent: Apr. 5, 2022

(54) DYNAMIC MULTIDIMENSIONAL ELECTRIC POTENTIAL AND ELECTRIC FIELD QUANTITATIVE MEASUREMENT SYSTEM AND METHOD

(71) Applicant: UNITED STATES OF AMERICA AS REPRESENTED BY THE ADMINISTRATOR OF NASA, Washington, DC (US)

(72) Inventor: Edward R. Generazio, Yorktown, VA (US)

(73) Assignee: UNITED STATES OF AMERICA AS REPRESENTED BY THE ADMINISTRATOR OF NASA

( * ) Notice: Subject to any disclaimer, the term of this patent is extended or adjusted under 35 U.S.C. 154(b) by 0 days.

(21) Appl. No.: 16/928,898

(22) Filed: Jul. 14, 2020

(65) Prior Publication Data
US 2020/0341045 A1    Oct. 29, 2020

Related U.S. Application Data

(63) Continuation of application No. 15/637,673, filed on Jun. 29, 2017, now Pat. No. 10,712,378.
(Continued)

(51) Int. Cl.
*G01N 27/60* (2006.01)
*G01R 29/12* (2006.01)
*G01R 29/08* (2006.01)

(52) U.S. Cl.
CPC ......... *G01R 29/12* (2013.01); *G01R 29/0878* (2013.01)

(58) Field of Classification Search
CPC .... G01R 29/08; G01R 29/0878; G01R 29/12; G01R 13/0218; G01R 31/024;
(Continued)

(56) References Cited

U.S. PATENT DOCUMENTS 3,273,397 A    9/1966    Forward
4,931,740 A    6/1990    Hassanzadeh et al.
(Continued)

FOREIGN PATENT DOCUMENTS

GB    2132357 A    7/1984
WO    2002067015 A1    8/2002
WO    2008152588 A2    12/2008

OTHER PUBLICATIONS

U.S. Appl. No. 15/177,798 to Generazio. (filed Jun. 9, 2016).
(Continued)

*Primary Examiner* — Thang X Le
(74) *Attorney, Agent, or Firm* — Shawn P. Gorman; Robin W. Edwards; Helen M. Galus

(57) ABSTRACT

Various embodiments provide a multi-dimensional electric potential sensor array to remotely quantitatively measure static, quasi-static, and dynamic electric potential and electric field in free space, and emanating and propagating from objects. Various embodiments enable the evaluation of the integrity of electronic circuits and electronic components by quantitatively and dynamically imaging electric potential generated during electronic circuit activation, operation, and deactivation. In various embodiments, the electrical potential of active electronics and objects of interest in containers may be quantitatively measured by the electric potential and electric field methods and by using specified materials in a combined structural and electronic component design to construct a multi-dimensional sensor array.

12 Claims, 16 Drawing Sheets

Related U.S. Application Data

(60) Provisional application No. 62/357,407, filed on Jul. 1, 2016.

(58) Field of Classification Search
CPC ...... G01N 27/26; G01N 27/60; G01N 27/327; G01N 27/4145; G01N 33/48707; G01N 33/48728
See application file for complete search history.

(56) References Cited

U.S. PATENT DOCUMENTS

| | | | |
|---|---|---|---|
| 5,019,804 | A | 5/1991 | Fraden |
| 5,164,673 | A | 11/1992 | Rosener |
| 5,430,381 | A | 7/1995 | Dower |
| 5,986,456 | A | 11/1999 | Yamashita |
| 6,025,726 | A | 2/2000 | Gershenfeld et al. |
| 6,031,378 | A | 2/2000 | Rosin |
| 6,645,144 | B1 | 11/2003 | Wen et al. |
| 6,661,115 | B2 | 12/2003 | Lester |
| 6,762,726 | B2 | 7/2004 | Alden |
| 7,119,553 | B2 | 10/2006 | Yang et al. |
| 7,154,275 | B2 | 12/2006 | Zank et al. |
| 7,242,298 | B2 | 7/2007 | Cehelnik |
| 7,295,019 | B2 | 11/2007 | Yang et al. |
| 7,330,032 | B2 | 2/2008 | Donnangelo |
| 7,471,089 | B2 | 12/2008 | Zerilli et al. |
| 8,264,247 | B2* | 9/2012 | Prance ............... G01R 19/0023 324/713 |
| 9,279,719 | B2 | 3/2016 | Generazio |
| 2002/0067169 | A1* | 6/2002 | Kato ............... G01R 31/31924 324/607 |
| 2006/0071669 | A1 | 4/2006 | Funato et al. |
| 2006/0164094 | A1 | 7/2006 | Golder et al. |
| 2007/0040545 | A1 | 2/2007 | Takiguchi |
| 2008/0246485 | A1 | 10/2008 | Hibbs et al. |
| 2008/0303530 | A1 | 12/2008 | Coutsornitros et al. |
| 2009/0284405 | A1 | 11/2009 | Salmon et al. |
| 2009/0295366 | A1 | 12/2009 | Cehelnik |
| 2009/0295644 | A1 | 12/2009 | Curran et al. |
| 2009/0309604 | A1 | 12/2009 | Zhang |
| 2010/0250140 | A1 | 9/2010 | Constable et al. |
| 2010/0259272 | A1 | 10/2010 | Care |
| 2010/0271291 | A1 | 10/2010 | Care |
| 2012/0013354 | A1 | 1/2012 | Bowler |
| 2012/0092019 | A1* | 4/2012 | Blum ............... F41H 11/136 324/457 |
| 2012/0199755 | A1* | 8/2012 | Generazio ............... G01J 1/42 250/395 |
| 2014/0346058 | A1* | 11/2014 | Robitzki ............... G01N 27/327 205/777.5 |
| 2015/0137825 | A1* | 5/2015 | Generazio ............... G01R 29/12 324/457 |
| 2016/0049885 | A1 | 2/2016 | Generazio |

OTHER PUBLICATIONS

Jackson, John D., "Classical Electrodynamics," Third Edition Book, 1999, Hoboken, New Jersey, United States: John Wiley & Sons.

Generazio, E. R., "Electric Potential and Electric Field Imaging with Applications," Materials Evaluation, Nov. 2015, pp. 1479-148, vol. 73, No. 11.

https://ocw.mit.edu/resources/res-6-002-electromagnetic-field-theory-a-problem-solving-approach-spring-2008/textbook-contents/—Chapter 3, p. 143, Accessed.

Generazio, E. R. et al., "Free-Carrier Absorption in Quantizing Magnetic Fields," Physical Review B, Dec. 15, 1979, pp. 5162-5167, vol. 20, No. 12.

AlphaLab Inc. "The TriboElectric Series" https://www.trifield.com/content/tribo-electric-series/. Visited at least as early as Oct. 2016.

Halliday, D. et al., "Fundamentals of Physics," 2005, pp. 421-423, Hoboken, John Wiley & Sons, Inc., New Jersey.

Horowitz, Paul and Hill, Winfield, "The Art of Electronics", 2nd Ed., Cambridge University Press, pp. 113-173, 1989.

Jackson, J.D., "Classical Electrodynamics", 3rd Ed. John Wiley & Sons, Hoboken, New Jersey, p. 52, 1999.

Fairchild Semiconductor Corporation, Junction Field Effector Transistor (JFET), http://www.fairchildsemi.com/ds/mp/mpf102.pdf, 2004.

\* cited by examiner

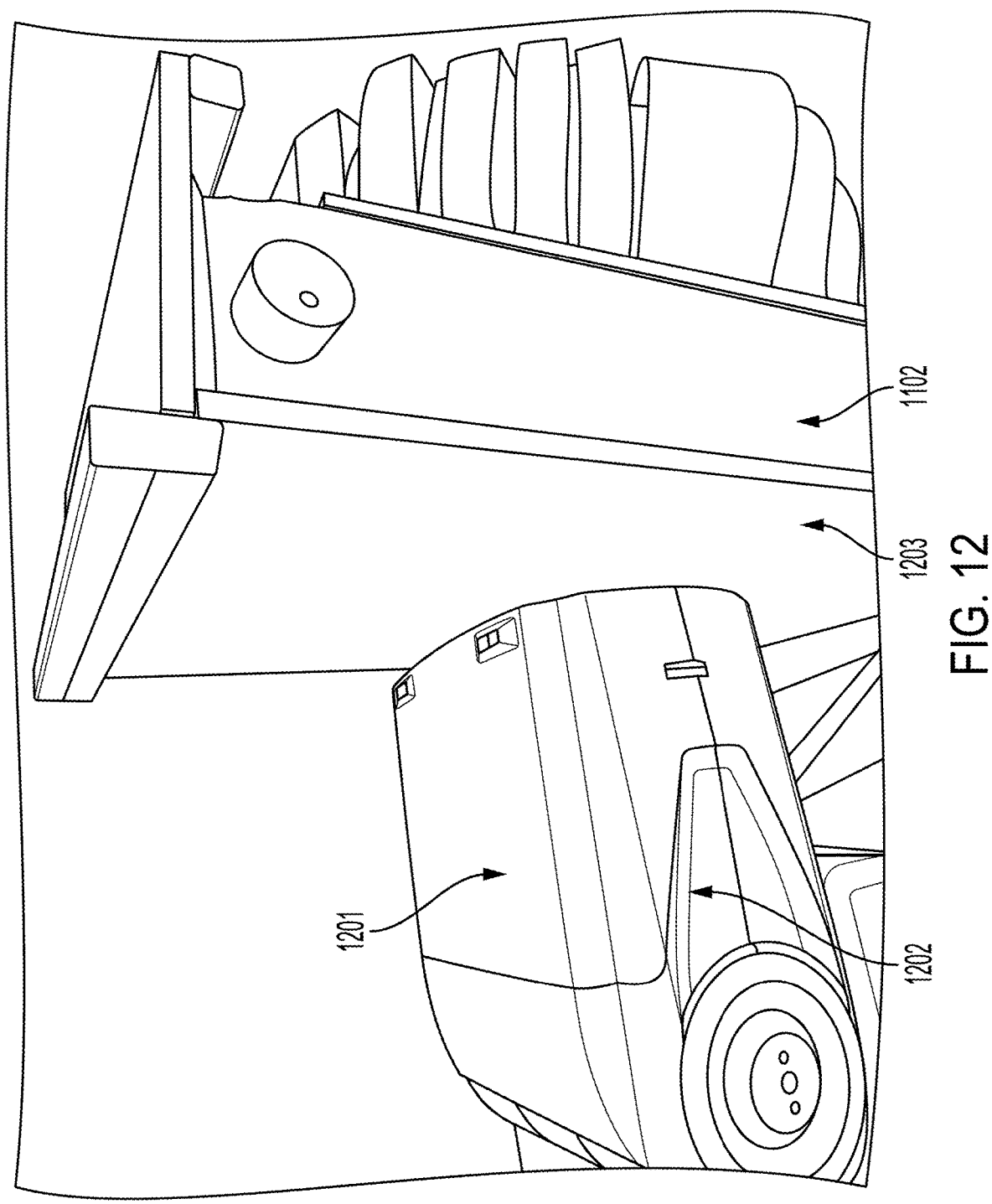

FIG. 14

DYNAMIC MULTIDIMENSIONAL ELECTRIC POTENTIAL AND ELECTRIC FIELD QUANTITATIVE MEASUREMENT SYSTEM AND METHOD

This patent application is a continuation of U.S. patent application Ser. No. 15/637,673 filed Jun. 29, 2017 and titled "Dynamic Multidimensional Electric Potential and Electric Field Quantitative Measurement System and Method", and claims the benefit of and priority to U.S. Provisional Patent Application Ser. No. 62/357,407 filed Jul. 1, 2016 and titled "Dynamic Multidimensional Electric Potential and Electric Field Quantitative Measurement System and Method" whereby the contents of each application are hereby incorporated by referenced in their entireties.

STATEMENT REGARDING FEDERALLY SPONSORED RESEARCH OR DEVELOPMENT

The invention described herein was made by an employee of the United States Government and may be manufactured and used by or for the Government of the United States of America for governmental purposes without the payment of any royalties thereon or therefore.

OVERVIEW

The present disclosure relates to sensors, and more particularly to sensors for measurements of electric potentials and electric fields.

For container inspections, electrical surface charges on the surface of containers are an important consideration in developing a credible electric potential and field container inspection system. For example, when measuring the electric potentials about a container holding a charged object, the measured potential as determined from outside of the container will be a combined electric potential due to the charged object plus the electrical potential due to the container. There is added complexity when the object of interest has a quasi-static or dynamically changing electric potential, such as that observed when an electronic circuit is activated, deactivated, and/or operating. Additionally, electric potential measurements made by scanning systems generally require that the electric potential sources are constant during the time it takes to scan the object of interest. Electric potential sources are not always constant for organic systems, systems with electrical and mechanical functions, objects or systems in motion, systems with internal or external components in operation, and systems utilizing plasma and fluid dynamics. Therefore, systems and methods are needed to dynamically and remotely locate and quantitatively measure the electrical potential of hidden contained electrical components exhibiting quasi-static or dynamic changes in electrical potential. Additionally, systems and methods to remotely quantitatively characterize static, quasi-static, and dynamic electric potentials and electric fields in real-time are needed.

SUMMARY

Various embodiments provide a multi-dimensional electric potential sensor array to remotely quantitatively measure static, quasi-static, and dynamic electric potential and electric field in free space, and emanating and propagating from or to objects. Various embodiments enable the evaluation of the integrity of electronic circuits and electronic components by quantitatively and dynamically imaging electric potentials generated during electronic circuit activation, operation, and deactivation. In various embodiments, the electrical potential of active electronics and objects of interest in containers may be quantitatively measured by the electric potential and electric field methods and by using specified materials in a combined structural and electronic component design to construct a multi-dimensional sensor array.

One embodiment of the present disclosure may provide a multi-dimensional electric potential sensor array including an array of electric potential sensors and a support casing supporting the array of electric potential sensors, wherein the support casing is triboelectrically neutral, has a low electric susceptibility, and is electrically non-conductive. In various embodiments, the electric potential sensors may include field effect transistors (FETs). In various embodiments, the array is configured in a series of rows of electric potential sensors and a series of columns of electric potential sensors. In various embodiments, the electric potential sensors include collinear electrodes. In various embodiments, the electric potential sensors include triaxial electrodes.

Another embodiment may provide a dynamic multidimensional electric potential and electric field quantitative measurement system including an embodiment multi-dimensional electric potential sensor array, an interface circuit connected to the multi-dimensional electric potential sensor array, a sampling circuit connected to the interface circuit, and a processing circuit connected to the sampling circuit. In various embodiments, the processing circuit may be configured to receive measurements of electrical potentials from the array of electric potential sensors and output an electric potential image based at least in part on the received measurements of electrical potentials from the array of electric potential sensors.

Another embodiment may provide a dynamic multidimensional electric potential and electric field quantitative measurement method including receiving, at a processing circuit, measurements of electrical potentials from an embodiment array of electric potential sensors, generating, at the processing circuit, at least one electric potential image based at least in part on the received measurements of electrical potentials from the array of electric potential sensors, and outputting, from the processing circuit, the at least one electric potential image on a display.

These and other features, advantages, and objects of the present disclosure will be further understood and appreciated by those skilled in the art by reference to the following specification, claims, and appended drawings.

BRIEF DESCRIPTION OF THE DRAWINGS

FIG. 12 illustrates a test conducted of the electric field imaging system of FIG. 11A, consistent with one or more embodiments of the present disclosure.

FIG. 14 shows the measured 2D electric potential as an image linear gray scale at the 2D array location at two different times from the test shown in FIG. 12, consistent with one or more embodiments of the present disclosure.

DETAILED DESCRIPTION

Figure 1:
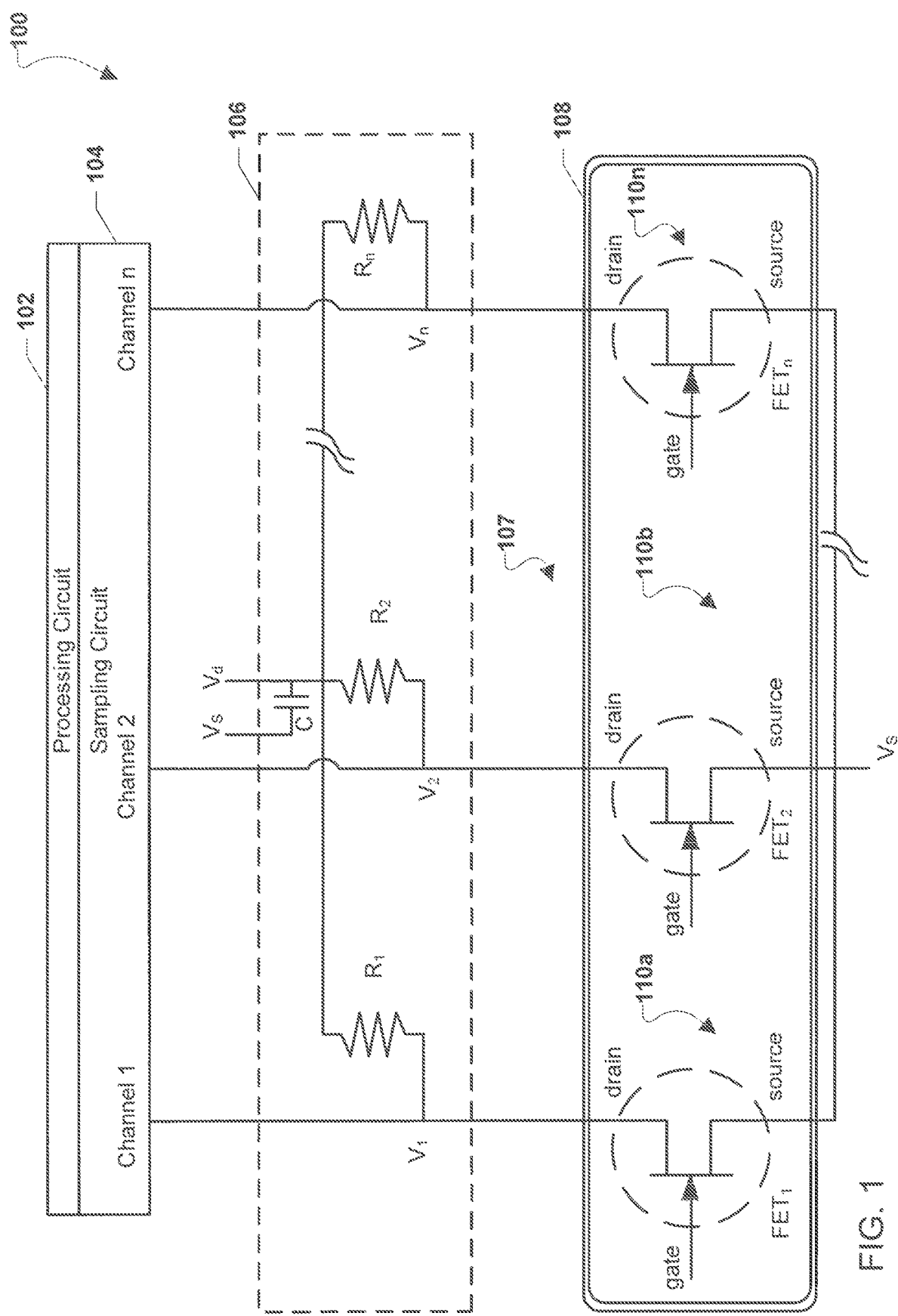
FIGS. 1-3 are schematic diagrams of electric potential measurement devices, consistent with one or more embodiments of the present disclosure.

Aspects of the present disclosure address challenges including those discussed above, and are applicable to a variety of applications, devices, systems, and methods for imaging electrical potentials and electric fields. These and other aspects of the present disclosure are exemplified in a number of implementations and applications, some of which are shown in the figures and characterized in the claims section that follows. It should be noted that the figures may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated embodiment need not have all the aspects or advantages shown. An aspect or an advantage described in conjunction with a particular embodiment is not necessarily limited to that embodiment and can be practiced in any other embodiments even if not so illustrated.

Various embodiments provide a multi-dimensional electric potential sensor array to remotely quantitatively measure static, quasi-static, and dynamic electric potential and electric field in free space, and emanating and propagating from and to objects. Various embodiments enable the evaluation of the integrity of electronic circuits and electronic components by quantitatively and dynamically imaging electric potential generated during electronic circuit activation, operation, and deactivation. In various embodiments, the electrical potential of active electronics and objects of interest in containers may be quantitatively measured by the electric potential and electric field methods and by using specified materials in a combined structural and electronic component design to construct a multi-dimensional sensor array.

Various embodiments may provide a multi-dimensional electric potential sensor array configured to dynamically and remotely quantitatively characterize static, quasi-static, and dynamic electric potentials and electric fields. The various embodiments may be remote and may not require physical contact with the electronic object of interest. In various embodiments, the electrical potential of the object of interest may vary spatially and may vary with time. By providing dynamic and remote measurements, the various embodiments may provide electric field imaging with direct applications to various technology areas, including detecting and monitoring hidden active electronic components, monitoring aerospace flight systems, monitoring national power system integrity, and providing a basis for expanding electrocadography to include electrocardo-imaging and electromyography to include electromyo-imaging. Various embodiments may be used for quality control, validation, fault detection and repair of hidden and non-hidden electronic circuits and electrical components. The various embodiments may provide for electric field security systems, quantitative inspection of electronic circuits on personnel, remote multi-level polygraphics, evaluation of gas and plasma dynamics, and micro-shutter operations and evaluation. Additionally, the various embodiments may be used for dynamic evaluation of electric properties of tribological coatings for space systems, and for automated tether quantitative quality monitoring and tether integrity monitoring. The various embodiments may also provide the basis for medical applications in non-contact and remote human electrocardo-imaging and electromyo-imaging. The various embodiments may also be suitable for use in security and quantitative inspection of electronic circuits on personnel, nuclear weapons, and aerospace fight systems.

Quantitative electric field imaging has required scanning by electric potential sensors to characterize the true electric fields emanating from objects. For example, U.S. Pat. No. 9,279,719 entitled ELECTRIC FIELD QUANTITATIVE MEASUREMENT SYSTEM AND METHOD describes a methodology for imaging electric potentials and electric fields and is hereby incorporated by reference in its entirety for all purposes). One or more embodiments may expand upon the methodology described in U.S. Pat. No. 9,279,719 to develop a multi-dimensional electric potential sensor array with the capability to dynamically and remotely quantitatively characterize static, quasi-static, and dynamic electric potentials and electric fields. One or more embodiments may be remote and may not require physical contact with the electronic object of interest to measure electric potentials. The electrical potential of the object of interest may vary spatially and may vary with time.

FIG. 1 is a schematic diagram of an electric potential measurement device 100 according to an embodiment. The electric potential measurement device 100 may include a two dimensional (2D) electric potential sensor array 107, interface circuit 106, a sampling circuit 104, and a processing circuit 102. The 2D electric potential sensor array 107 may include any number of sensors supported in a support casing 108. The 2D electric potential sensor array 107 may be the active part of the measurement device 100. In this example, the sensors 110$a$, 110$b$, . . . 110$n$ are illustrated as field effect transistors (FETs) in FIG. 1. The FETs may include various types of FETs including, for example, junction FETs (JFETs), metal-oxide-semiconductor FETs (MOSFETS), heterostructure insulated gate FETs (HIGFETs), depleted substrate FETs (DEPFETs), and/or tunnel FETs (TFETs). While the array of sensors 110a, 110b, . . . 110n are illustrated and described with reference to FETs, the sensors 110a, 110b, . . . 110n may be implemented using devices other than FETs. As examples, high impedance transistors, operational amplifiers, and/or quantum dot network components may be substituted for the FETs in various embodiments. In an example configuration of the measurement device 100, sensors 110a, 110b, . . . 110n may each be single measurement devices consisting of a $FET_1$, $FET_2$, . . . $FET_n$, respectively, with each FETs' drain connected in a floating gate configuration, where electric potential of the gate is allowed to float. In this configuration, the electric potential of the gate is influenced by electric potentials and/or fields in the operating environment. With a voltage different across source and drain terminals of the FET, transconductance of and current passed by the FET is modulated by the electric potentials and/or fields. Using current passed by the FET, the electric potentials and/or fields may be measured.

The support casing 108 may be formed from materials that do not support surface charges, both bound and unbound, or images charges. Surface charges, bound or unbound, and/or images charges may distort the true original electric field to be measured. The materials that may be used in the support casing 108 may be triboelectrically neutral, have a low electric susceptibility, and may be electrically non-conductive. Generally speaking, a triboelectrically neutral material resists charging when contacted with another material. Electric susceptibility indicates the degree that a dielectric material becomes polarized in response to an applied electric field. A material is considered to have a low electric susceptibility if the material does not become sufficiently polarized to induce a sheet charge at its surface when placed in an electric field.

In different embodiments, the support casing may be formed using various materials including, for example, wood, thermosetting phenol formaldehyde resin-based materials such as polyoxybenzylmethylenglycolanhydride, Bakelite, and/or Garolite XX, or various combinations thereof. As an example, a measurement system using macroscopic discrete FETs may use dry balsa wood and Garolite XX support casings that have adequately low electric susceptibilities. In contrast, a measurement system having a dimension of 100 microns may have a very porous support casing of similar materials with dielectric constants near 1.0. For additional information regarding selection of suitable casing materials, reference may be made to U.S. patent application Ser. No. 15/177,798 entitled Solid State Ephemeral Electric Potential and Electric Field Sensor filed Jun. 9, 2016, which is fully incorporated by reference herein.

The 2D electric potential sensor array 107 may be located remotely from the rest of the electrical components, such as the interface circuit 106, sampling circuit 104, and processing circuit 102, and electrical wires that makeup the electric potential measurement device 100. In various embodiments, only small diameter wires may be used to carry the measured voltages, such as $V_1$, $V_2$, . . . $V_n$. The smallness of the wires may depend on the scale of the measurement system. As an example, for a measurement system using a macroscopic discrete FET having dimensions of 5 mm, small wires may be wires with a 0.1 mm diameter. In contrast, a measurement system having a dimension of 100 of microns may have wire diameters much less than 100 microns. The effect that the select materials or wire diameter has on distorting the original undisturbed electric field may be determined as taught in U.S. patent application Ser. No. 15/177,798, filed Jun. 10, 2016, (entitled SOLID STATE EPHEMERAL ELECTRIC POTENTIAL AND ELECTRIC FIELD SENSOR), which is incorporated herein by reference in its entirety for all purposes.

For example, small diameter magnet wires without additional electrical insulation may be used as those type wires may not distort the true original electric field to be measured. As other examples, small diameter wire without insulation, small diameter wire with electrical non-conductive insulation having neutral triboelectric properties and low electric susceptibility may be used to carry the measured voltages, such as $V_1$, $V_2$, . . . $V_n$. Small diameter magnet wire, small diameter wire without insulation, small diameter wire with electrical non-conductive insulation having neutral triboelectric properties and low electric susceptibility may be preferred wiring configurations so as to not disturb the electric field to be measured. Other electrical insulation materials and wire diameters may be used yielding various degrees of impact on the uncertainties of the quantified measurements without departing from the scope of the various embodiments. For example, thermoplastic insulation materials, such as, polyvinyl chloride, etc., polytetrafluoroethylene (PTFE), or thermoset insulation materials, such as neoprene, natural rubber, etc., may generally have both large magnitude triboelectric affinities and large electrical susceptibilities when compared to materials such as wool and cotton, and these thermoplastic and thermoset insulations may impact the uncertainties of the quantified measurements. When wire insulation materials with larger magnitude triboelectric properties are used in various embodiments, the wire insulation may be deionized when wire movement occurs or when wire is contacted with any material. When larger diameter wires and wire insulation with higher electric susceptibility are used in various embodiments, electrical potentials due to the presence of larger conductive wire and higher electric susceptibility may be included in the analyses determining the true original electric potential.

In this example, the device 100 includes an interface circuit 106 coupled to the sensor FETs 110a, 110b, . . . 110n. The interface circuit 106 provides signals $V_1$, $V_2$, . . . $V_N$ indicative of the electric potential and/or field measurements to circuit 104 for sampling. In this example, the interface circuit 106 includes a respective resistor $R_1$, $R_2$, . . . $R_n$ for each of the sensor FETs 110a, 110b, . . . 110n. The current path through a respective FET (e.g., 110n) is routed through a respective one of the resistors (e.g., $R_N$), thereby converting the current to a voltage difference (e.g., $V_N$-$V_d$). The voltage is $V_N$ is provided to and sampled by circuit 104 to quantize the electric potential and/or field measured by the respective sensor FET 110n.

Component values of the interface circuit 106 may be adapted to fit the needs of a particular application. In some implementations, resistor values may be selected to allow FETs to pass a large currents that without exceeding performance ratings of the FET. Using high currents allows increased sensitivity the current to the electric potential of the gate.

In an example embodiment, sensors in FIG. 1 may be Motorola MPR102 JFETs and $R_1$, $R_2$, . . . $R_n$ resistors may be 360 Ohms precision resistors at 0.1%. Vs and $V_d$ reference voltages may be set to 9V and GND respectively by a 9V power supply with ±0.0055 ripple. In some implementations, a battery power supply may be used to eliminate power supply ripple.

In some embodiments, cross-talk may occur between different sensors connected to a common voltage node (e.g., $V_d$). For instance, signal components from one output signal (e.g., $V_1$) may transfer to other output signals $V_2$ and $V_N$ via the resistors $R_1$, $R_2$, ... $R_n$. In some embodiments, a filter capacitor C may be included to mitigate cross-talk interference between sensors. For instance, in the example shown in FIG. 1, the resistors $R_1$, $R_2$, ... $R_n$ combined with the capacitor C effectively create a set of low pass filters, which prevent high frequency fluctuations in an output signal (e.g., $V_N$) affecting the other output signals $V_1$ and $V_2$. The values of R and C may be adjusted, for a particular application to configure such low-pass filters to filter a particular frequency range of concern.

The measured voltage, such as $V_1$, $V_2$, ... $V_n$, from a sensor, such as one of sensors 110a, 110b, ... 110n, may be applied to a unique input channel, Channel 1, Channel 2, ... Channel n, of the sampling circuit 104 connected to the CPU 102. For example, $V_1$ may be connected to Channel 1 of the sampling circuit 104, $V_2$ may be connected to Channel 2 of the sampling circuit 104, and so on through $V_n$ connected to Channel n of the sampling circuit 104. Sampling circuit 104 may only have a limited number of data acquisition channels, so a respective interface circuit 106 may be used per sampling circuit 104. As such, in various embodiments, additional sampling circuits and interface circuits may be used in an unlimited fashion to assure that all measurement devices of a sensor array are uniquely connected to a unique channel on a sampling circuit. In various embodiments, additional electronic filtering may be provided by adding precision filtering electrical components before or after the measurement is presented to the interface circuit 106. Electronic filter may also provided by the sampling circuit 104 or signal analyses routines provided by the processing circuit 102.

Data acquisition, data analyses, and data storage may be controlled by the processing circuit 102. Measurement data may be acquired at any rate within the capability of the electronics. The processing circuit 102 may store the measurement data, analyze the data, and the data may be output from the processing circuit 102 to a display device for visualization to a user of the measurement device 100.

In some embodiments, the sensors and/or interface circuit may be implemented using various other circuit arrangements in in-lieu of those shown in FIG. 1. For example, for additional information on some other FETs circuit arrangements that may be used to implement sensors, reference may be made to U.S. Pat. No. 9,299,719 (entitled ELECTRIC FIELD QUANTITATIVE MEASUREMENT SYSTEM AND METHOD), and U.S. Patent Publication 2015/0137825 (entitled Ephemeral Electric Potential and Electric Field Sensor), which are incorporated herein by reference in their entirety.

Figure 2:
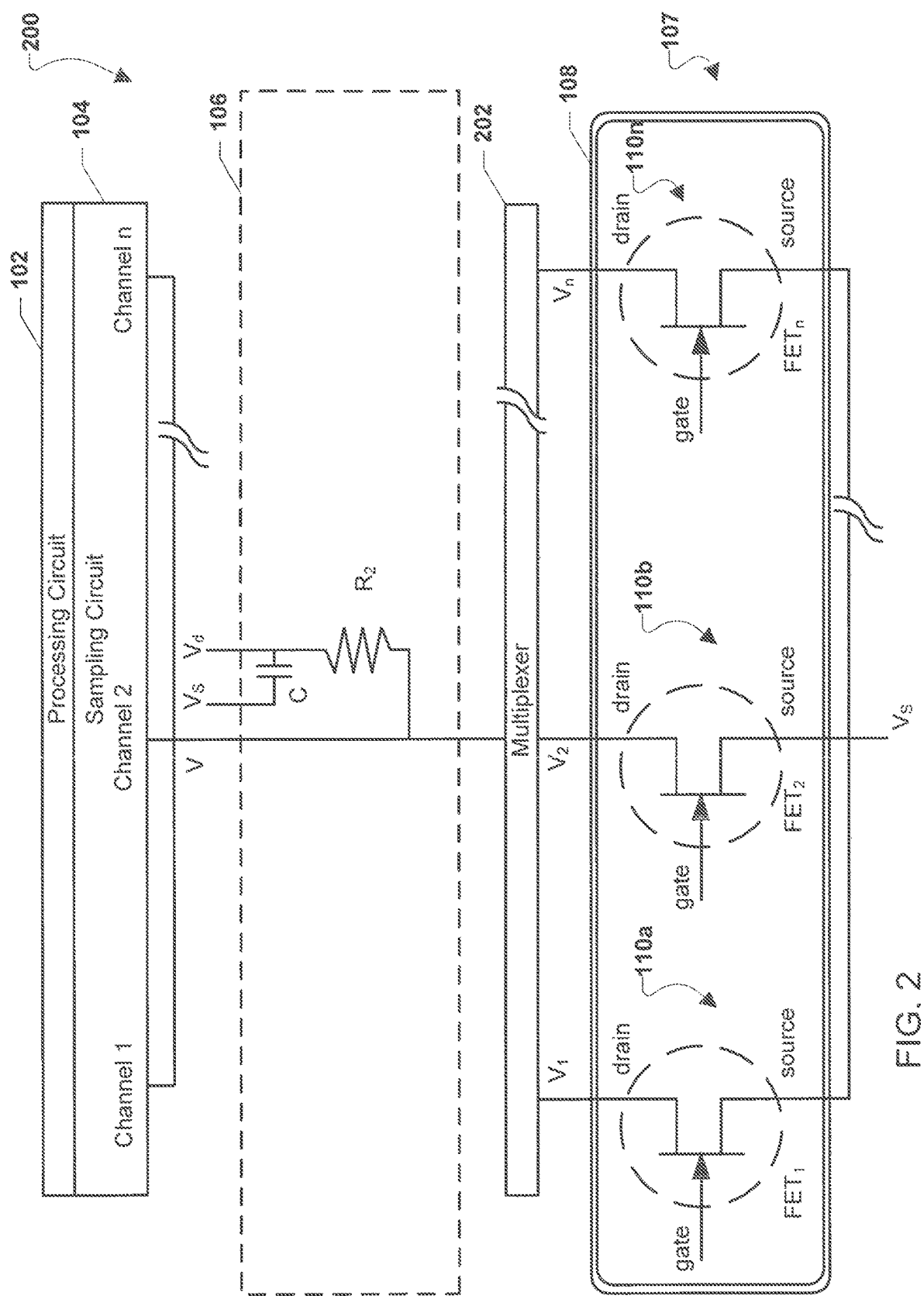

FIG. 2 is a schematic diagram of an electric potential measurement device 200 according to an alternate embodiment. Measurement device 200 may include a multiplexer 202 disposed between the sensor array 107 and the interface circuit 106. Measurement device 200 may be similar to measurement device 100, except that a multiplexer 202 may be used such that a combined voltage V from one or more FETs, such as $FET_1$, $FET_2$, ... $FET_n$, of the sensor array 107 may be applied to one or more channels reducing the number of wires from the sensing array 107 to the interface circuit 106 and the number of wires connecting the interface circuit 106 to the sampling circuit 104 in comparison to measurement device 100.

Figure 3:
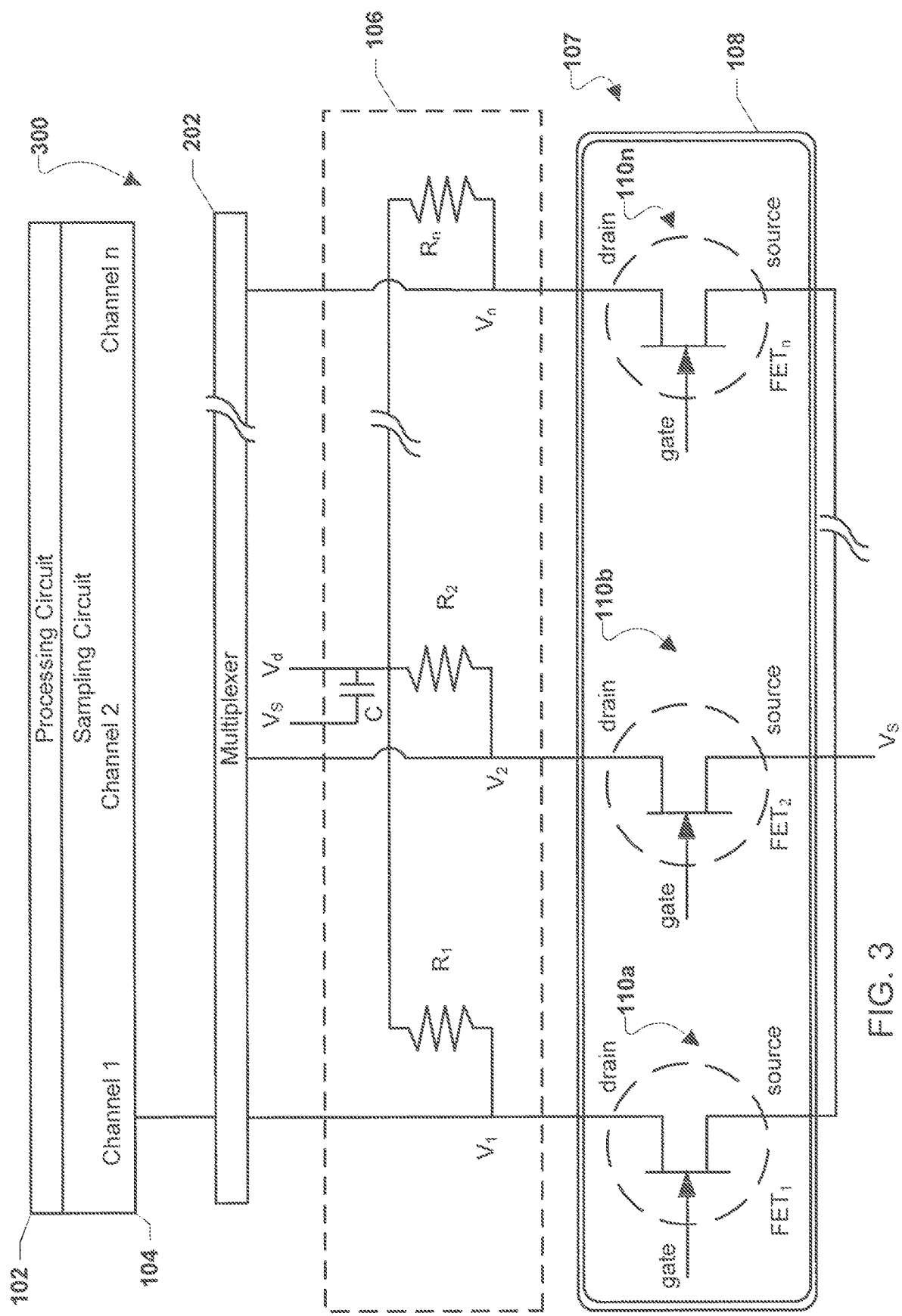

FIG. 3 is a schematic diagram of an electric potential measurement device 300 according to another alternate embodiment. Measurement device 300 may include a multiplexer 202 disposed between the interface circuit 106 and sampling circuit 104. Measurement device 300 may be similar to measurement device 100, except that a multiplexer 202 may be used such that a combined voltage V from one or more FETs, such as $FET_1$, $FET_2$, ... $FET_n$, of the sensor array 107 may be applied to one or more channels reducing the number of wires connecting the interface circuit 106 to the sampling circuit 104 in comparison to measurement device 100.

The presence of the multiplexer 202 may decrease the time resolution of the measurement from a single FET, such as $FET_1$, $FET_2$, ... $FET_n$, while allowing increased time resolution, by use of multiple data acquisition triggers on different channels monitoring the same sensor 110a, 110b, ... 110n, when FETs, such as $FET_1$, $FET_2$, ... $FET_n$, are connected to more than one channel. The introduction of multiplexers 202 and additional electronics, such as filters, near a sensing array may distort of the true original electric field and such distortion may increase the uncertainty of the measurement values.

In various embodiments, measurement device voltages $V_s$ and $V_d$ may be supplied by any power source, such as by batteries, wireless power systems, etc. Wireless communication methods and wireless transmitters/receivers/transceivers may be substituted for the wires in various embodiments to enable transmission of voltage measurements, such as voltages V, $V_1$, $V_2$, ... $V_n$, etc., thereby eliminating or minimizing the need for wires. The introduction of batteries and wireless communications, etc., near a sensor array 107 may also distort the true original electric field increasing the uncertainty of the measurement values.

A 2D sensor array, such as a 2D sensor array of FETs (e.g., sensor array 107) may allow for multi-dimensional spatial imaging of electric potential as a function of time. Thus, a 2D sensor array providing multi-dimensional spatial imaging of electric potential as a function of time may have an advantage over a one dimensional array that is used to scan a two dimensional area or three dimensional volumes over a period of time. A 2D sensor array may be used to produce real-time and high speed images of electrical potential over large areas. In some embodiments, a 2D sensor array may record data faster than a video frame rate of a display outputting the data as real-time and high speed images of the electrical potential, thereby causing the display to appear in slow motion.

Figures 4A, 4B:
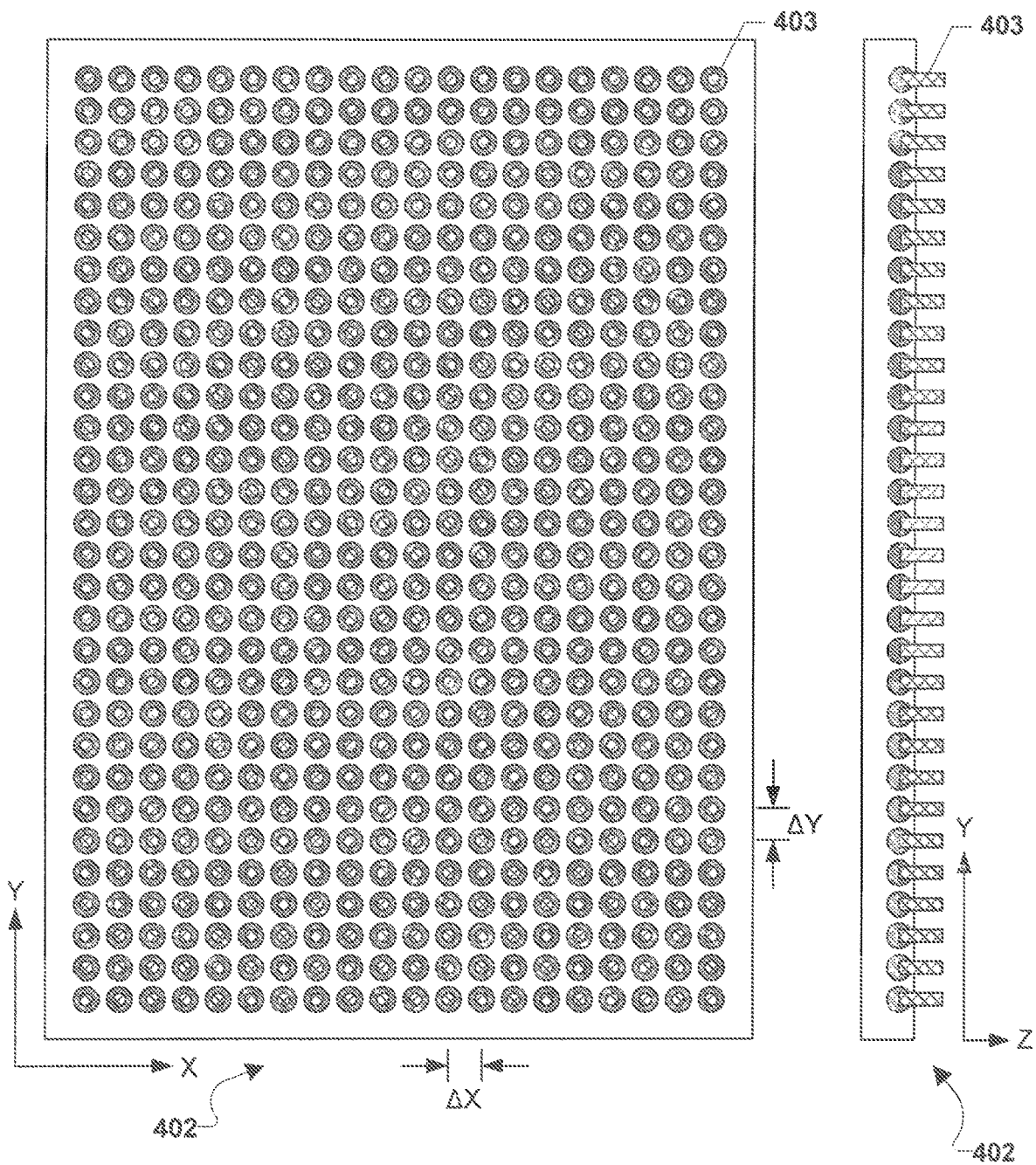
FIGS. 4A and 4B are block diagrams of the front and side views, respectively, of a FET sensor array, consistent with one or more embodiments of the present disclosure

FIGS. 4A and 4B are block diagrams of the front (FIG. 4A) and side (FIG. 4B) views of a 600 element FET sensor array 402. Sensor array 402 may be a specific example of sensor array 107 described above with reference to FIGS. 1-3. The sensor array 402 may include, for example, 30 FET elements 403 in each single column along the Y-direction and 20 FET elements 403 in each single row in the X direction. Sensors in the array may be supported, for example, using materials used for the support casing 108 described with reference to FIG. 1.

The gate electrode of the FET is illustrated in the Z-direction. The gate electrode may have a length along the Z-direction. A coordinate system of row and column numbering may identify the individual FET 403 locations in the array 402. While illustrated as a 600 element array in rows and columns, other multidimensional nonlinear array arrangements of FETs may be used in the various embodiments and the FETs need not be discrete components in the various embodiments.

Determination of the electric field requires differencing of the measured electrical potential over known distances in the X, Y and Z directions. For example, the method for determining measured electrical potential taught in U.S. Pat. No. 9,279,719 may be used to determine the electric field. When the electrical potential as a function of distance along X and Y axes is measured at two different positions along the Z axis, the electric field magnitude, electric field direction, and X, Y, and Z components of the electric field may be determined.

Figure 5:
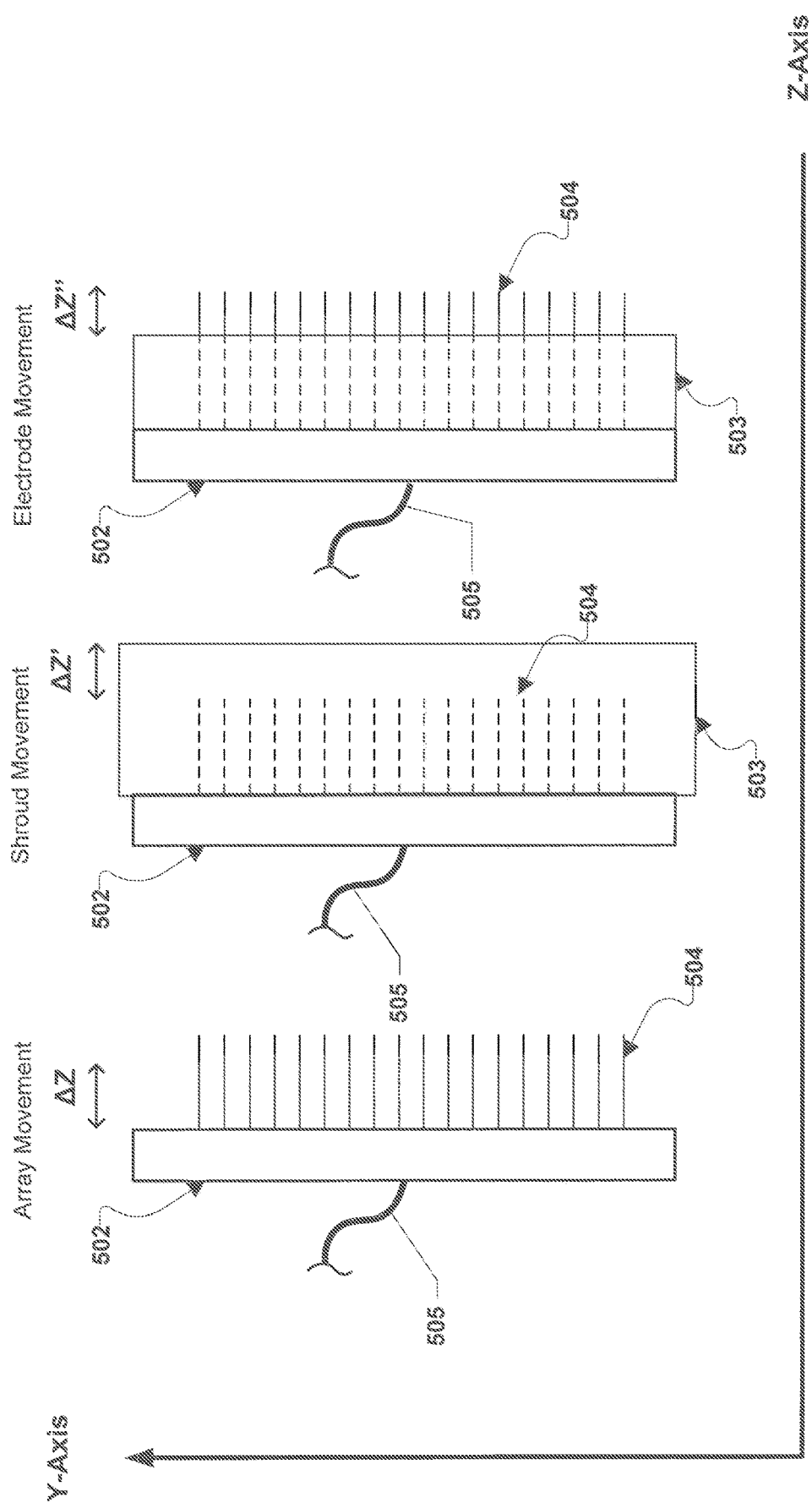
FIG. 5 illustrates three different methods for measuring the electric potential in various X-Y planes along the Z axis, consistent with one or more embodiments of the present disclosure.

FIG. 5 illustrates three different methods for measuring the electric potential in various X-Y planes along the Z axis. The three different methods illustrated in FIG. 5 are an array movement method, a shroud movement method, and an electrode movement method. In the array movement method, measurements in the X-Y plane may be made at one point on the Z-Axis. The sensor array, such as sensor arrays 107 and/or 402 described above, may include an array support 502 with a 2D array of gate electrodes 504 and power and measurement cables 505. The sensor array may be moved a distance of ΔZ and measurements in the X-Y plane at ΔZ may be made. In the shroud movement method, the sensor array may further include a moveable shroud 503, and the shroud 503 may also be used to move the sensor array a preset distance ΔZ' along the Z axis. The shroud 503 may also be triboelectrically neutral, have a low electric susceptibility, and be electrically non-conductive. The shroud method may be suitable for use in a hand held implementation. In the electrode movement method, the gate electrodes 504 may be extendable or retractable to move a distance ΔZ" along the Z axis and measurements in the X-Y plane at ΔZ" may be made. When using extendable or retractable gate electrodes 504, the electrostatic mean value theorem may be used to determine the value of ΔZ" required such that ΔZ" is providing measurement at the expected ΔZ". A variety of methods may be used for varying the length of the gate electrodes 504, including extension and retraction mechanisms that are mechanical, pneumatic, hydraulic, electrical, magnetic, etc. In more complex array configurations, the length individual electrodes 504 may be independently varied depending on their location in the sensor array and the measurement data needed.

The electric field, $\vec{E}$, and electric field spatial components $\vec{E}_x$, $\vec{E}_y$, $\vec{E}_z$ may be obtained using the relation as shown as follows in Equation (1):

$$\vec{E}(X, Y, Z) = -\vec{\nabla} V(X, Y, Z) = -\left[\frac{\partial V(X, Y, Z)}{\partial x}\hat{i} + \frac{\partial V(X, Y, Z)}{\partial y}\hat{j} + \frac{\partial V(X, Y, Z)}{\partial z}\hat{k}\right] \quad (1)$$

where $V(X, Y, Z)$ is the measured electrostatic potential with x, y, and z coordinates and $\hat{i}$, $\hat{j}$, and $\hat{k}$ are unit vectors in the x, y, and z directions, respectively.

$$\frac{\partial V(X, Y, Z)}{\partial x}, \frac{\partial V(X, Y, Z)}{\partial y}, \text{and } \frac{\partial V(X, Y, Z)}{\partial z}$$

are the partial derivatives of the electric potential with respect to x, y, and z, respectively.

Equation (1) may be approximated for any point $X_i$, $Y_i$, $Z_i$ as follows:

$$\vec{E}(X_i, Y_i, Z_i) \approx -\left[\left(\frac{V(X_{i+1}, Y_i, Z_i) - V(X_i, Y_i, Z_i)}{X_{i+1} - X_i}\right)\hat{i} + \left(\frac{V(X_i, Y_{i+1}, Z_i) - V(X_i, Y_i, Z_i)}{Y_{i+1} - Y_i}\right)\hat{j} + \left(\frac{V(X_i, Y_i, Z_{i+1}) - V(X_i, Y_i, Z_i)}{Z_{i+1} - Z_i}\right)\hat{k}\right].$$

Equation (1) may be applicable for electrostatic and quasi-electrostatic fields as described in U.S. Pat. No. 9,279,719 and U.S. Patent Publication No. 2016/0049885 (incorporated herein by reference in its entirety for all purposes). Other analyses and measurement configuration approaches may be used in various embodiments, for example, using curvilinear or polar coordinates, as well as determining the electric potential and electric field as a function of time z and spatial location. The electric field as a function of time z and spatial location X, Y, Z may be as shown as follows in Equation (2):

$$\vec{E}(X, Y, Z, \tau) = -\vec{\nabla} V(X, Y, Z, \tau) = -\left[\frac{\partial V(X, Y, Z, \tau)}{\partial x}\hat{i} + \frac{\partial V(X, Y, Z, \tau)}{\partial y}\hat{j} + \frac{\partial V(X, Y, Z, \tau)}{\partial z}\hat{k}\right] \quad (2)$$

where $V(X, Y, Z, \tau)$ is the measured electrostatic potential with x, y, and z coordinates at a time τ, and $\hat{i}$, $\hat{j}$, and $\hat{k}$ are unit vectors in the x, y, and z directions, respectively.

$$\frac{\partial V(X, Y, Z, \tau)}{\partial x},$$

$$\frac{\partial V(X, Y, Z, \tau)}{\partial y}, \text{and } \frac{\partial V(X, Y, Z, \tau)}{\partial z}$$

are the partial derivatives of the electric potential at time, with respect to x, y, and z, respectively.

Equation (2) may be approximated for any spatial point $X_i(\tau)$, $Y_i(\tau)$, $Z_i(\tau)$ at time τ as follows:

$$\vec{E}(X_i(\tau), Y_i(\tau), Z_i(\tau), \tau) = -\vec{\nabla} V(X_i(\tau), Y_i(\tau), Z_i(\tau), \tau) \approx -\left[\left(\frac{V(X_{i+1}(\tau), Y_i(\tau), Z_i(\tau), \tau) - V(X_i, (\tau), Y_i(\tau), Z_i(\tau), \tau)}{X_{i+1}(\tau) - X_i(\tau)}\right)\hat{i} + \left(\frac{V(X_i(\tau), Y_{i+1}(\tau), Z_i(\tau), \tau) - V(X_i(\tau), Y_i(\tau), Z_i(\tau), \tau)}{Y_{i+1}(\tau) - Y_i(\tau)}\right)\hat{j} + \left(\frac{V(X_i(\tau), Y_i(\tau), Z_{i+1}(\tau), \tau) - V(X_i(\tau), Y_i(\tau), Z_i(\tau), \tau)}{Z_{i+1}(\tau) - Z_i(\tau)}\right)\hat{k}\right].$$

Figure 6:
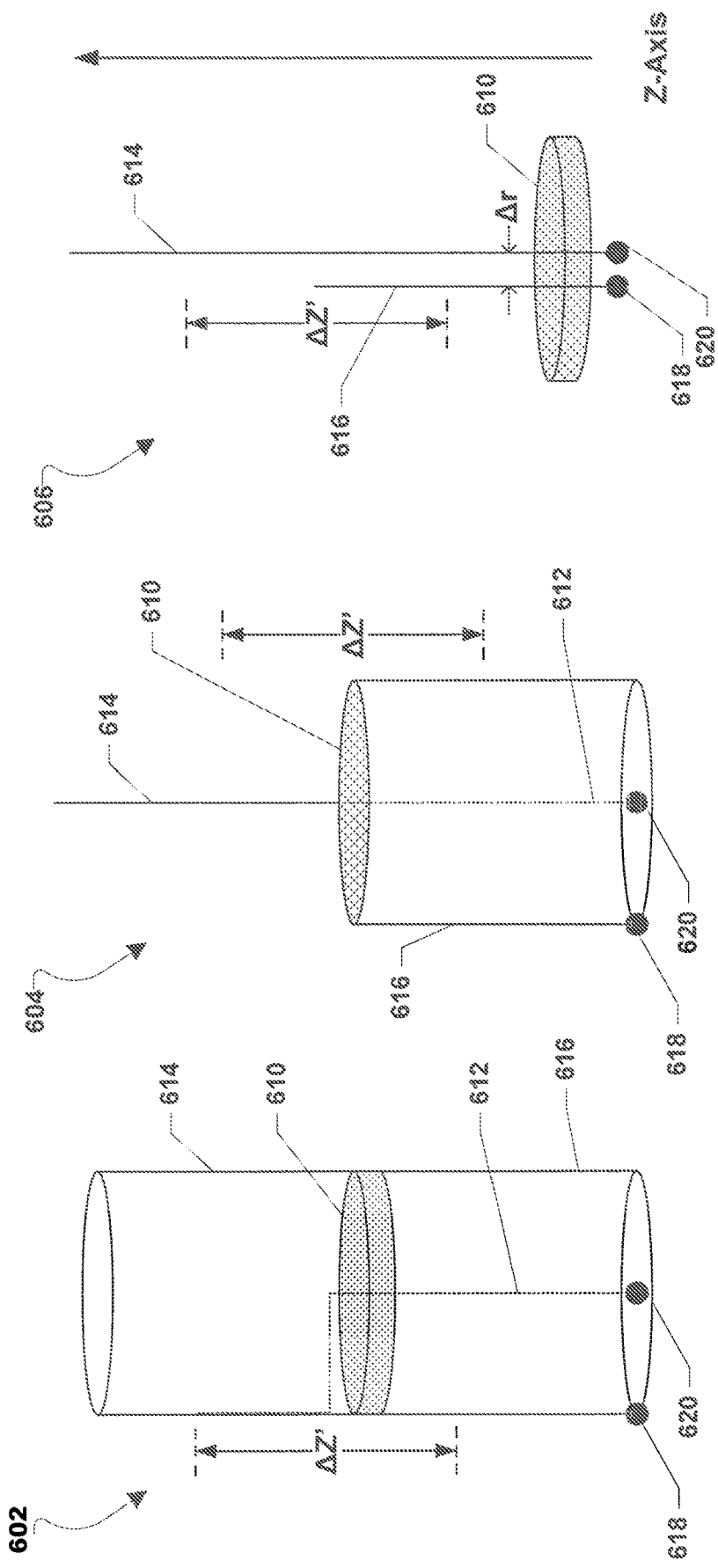
FIG. 6 illustrates examples of dual element sensor electrode systems allowing for the electrical potential at two positions along a direction to be simultaneously measured, consistent with one or more embodiments of the present disclosure.

In various embodiments, sets of collinear or triaxial sensor electrodes may allow for direct measurement of $\vec{E}(X_i(\tau), Y_i(\tau), Z_i(\tau), \tau)$ without requiring movement of the sensor array electrodes. For example, collinear or triaxial sensor electrodes may be used in sensor arrays 107 and/or 402 described above. FIG. 6 illustrates examples of dual element sensor electrode systems 602, 604, and 606 allowing for the electrical potential at two positions along a direction, for example, the Z axis, to be simultaneously measured. Dual element sensor electrode system 602 includes upper 614 and lower 616 electrode elements supported by a triboelectrically neutral, low electric susceptibility, and electrically non-conductive material 610. A gap with no material may also be used. The electrodes 614 and 616 may be filled with a triboelectrically neutral, low electric susceptibility, and electrically non-conductive material. Electrically connections to the electrode elements are via contacts on the lower conductor 618 connected to a first FET gate and connector 620 connected to a second FET gate, which has a coaxial wire 612 connected to the upper electrode 614. The connecting wires 612 may be small diameter magnet wire, small diameter wire without insulation, or small diameter wire with electrical non-conductive insulation having neutral triboelectric properties and low electric susceptibility so as to not disturb the electric field to be measured. Dual element sensor electrode system 604 includes a dual sensor electrode with a coaxial upper electrode 614 being a different diameter than the lower electrode 616. The volume between the electrode 614 and electrode 616 may be filled with a triboelectrically neutral, low electric susceptibility, and electrically non-conductive material 610 or a gap with no material may also be used. Dual element sensor electrode system 606 includes a dual element sensor where the lower electrode 616 may not be coaxial and may be offset a distance Δr from the axis of electrode 614. Electrodes 614 and 616 may be supported by a triboelectrically neutral, low electric susceptibility, and electrically non-conductive material 610. A small offset distance Δr may be preferred. If Δr is much less than the radius of the material 610, then the system may be a dual element system. If Δr has a dimension of ΔX or ΔY (see e.g., FIG. 4A), the array (such as the array illustrated in FIG. 4A) may be an array of dual elements with every other electrode have a length varying by ΔZ'. Differencing the electrical potential between the two electrodes 614 and 616 and dividing by the fixed distance between the two electrodes along the Z direction, yields the Z component of the electric field at point X, Y, Z as a function of time as follows:

$$\vec{E_Z}(X_i(\tau), Y_i(\tau), Z_i(\tau), \tau) = -\left(\frac{\Delta V_Z(\Delta Z', \tau)}{\Delta Z'}\right)\hat{k}$$

where $\Delta V_Z(\Delta Z', \tau)$ is the difference in electrical potential over the distance ΔZ' in the Z direction at a time τ.

Dual element sensors may also be configured in the X and Y directions and evaluated in the same manner to yield the X and Y components of the electric field as function of time providing yielding the electric field at any point X, Y, Z as a function of time according to the following:

$$\vec{E}(X_i(\tau), Y_i(\tau), Z_i(\tau), \tau) = \vec{E_X}(X_i(\tau), Y_i(\tau), Z_i(\tau), \tau) + $$
$$\vec{E_Y}(X_i(\tau), Y_i(\tau), Z_i(\tau), \tau) + \vec{E_Z}(X_i(\tau), Y_i(\tau), Z_i(\tau), \tau)$$
$$\vec{E}(X_i(\tau), Y_i(\tau), Z_i(\tau), \tau) = -\left[\left(\frac{\Delta V_X(\Delta X', \tau)}{\Delta X'}\right)\hat{i} + \left(\frac{\Delta V_Y(\Delta Y', \tau)}{\Delta Y'}\right)\hat{j} + \left(\frac{\Delta V_Z(\Delta Z', \tau)}{\Delta Z'}\right)\hat{k}\right]$$

where $\Delta V_X(\Delta X', \tau)$ and $\Delta V_Y(\Delta Y', \tau)$ are the difference in electrical potential, at a time τ, over the distance ΔX' in the X direction and over the distance ΔY' in the Y direction, respectively.

Figure 7:
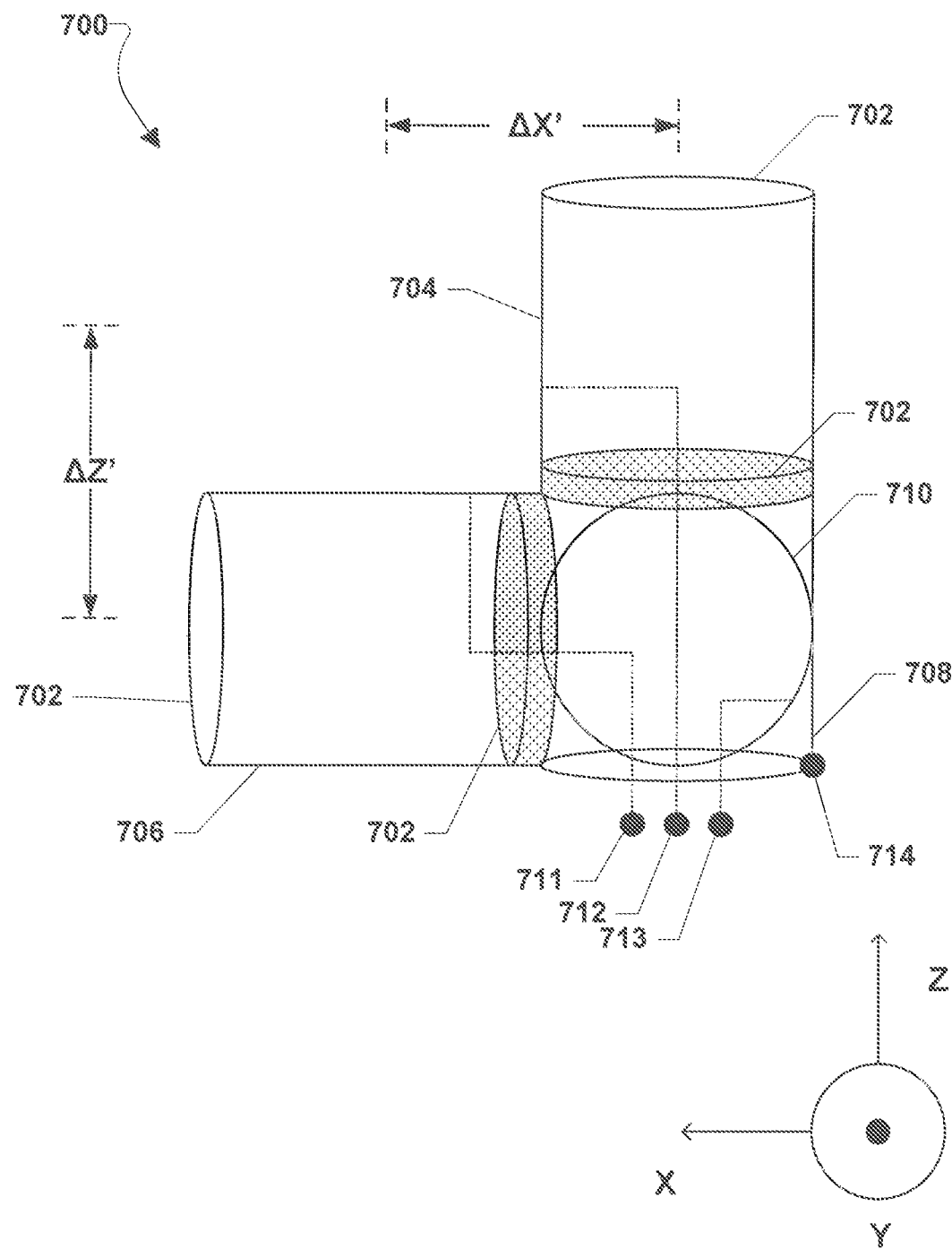
FIGS. 7 and 8 illustrate a triaxial electrode viewed along the Y direction and the X direction, respectively, consistent with one or more embodiments of the present disclosure.
Figure 8:
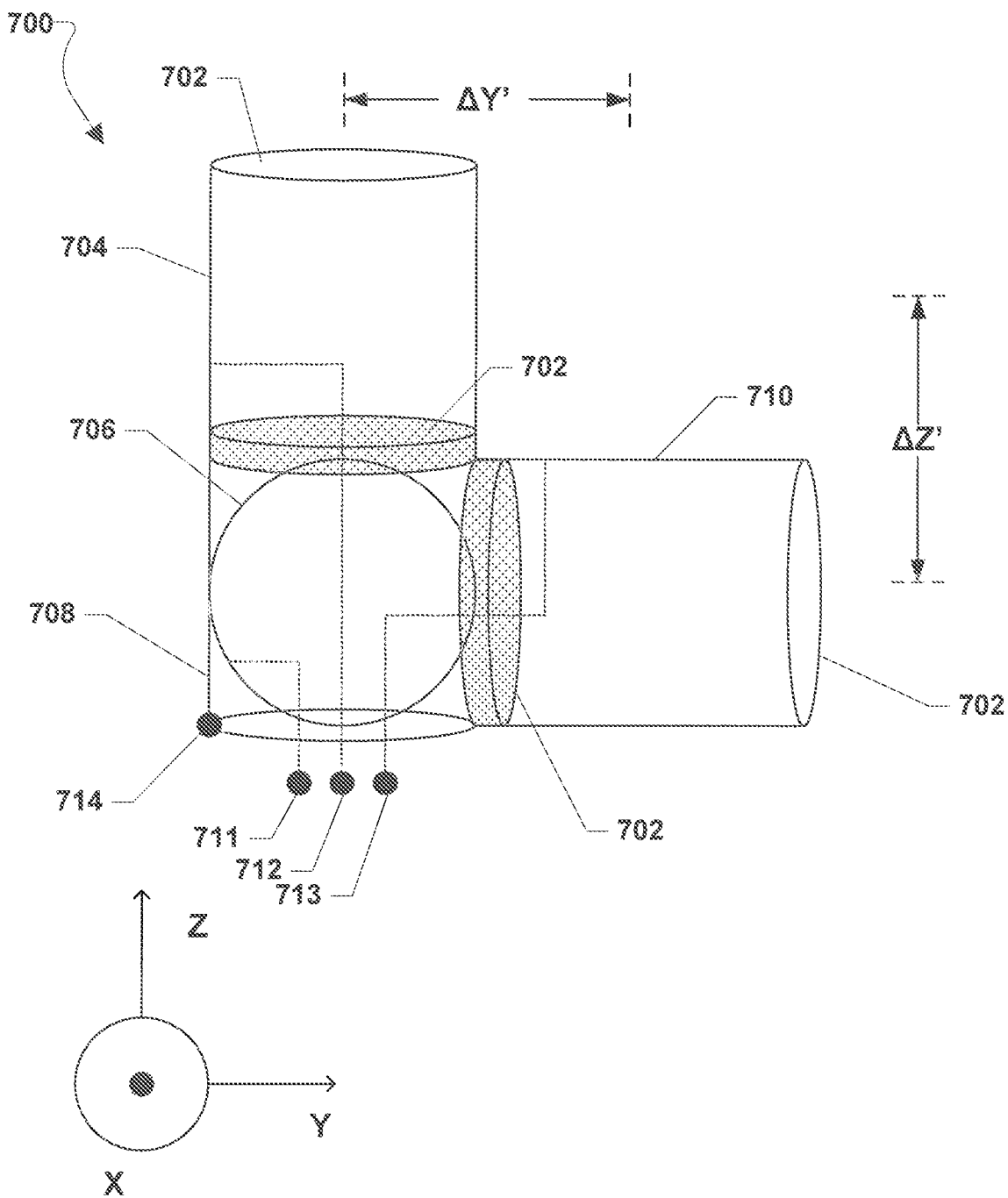

A triaxial electrode 700 is shown in FIG. 7 as viewed along the Y direction and is shown in FIG. 8 as viewed along the X direction. The triaxial electrode 700 may have a base electrode 708 at position X, Y, Z. There may be three other electrodes, 704, 706, and 710. Electrode 706 may be the electrode along the X-axis, electrode 710 may be the electrode along the Y-axis, and electrode 704 may be the electrode along the Z-axis, with each electrode 704, 706, and 710 aligned orthogonally along their respective X, Y and Z directions. The electrodes 704, 706, and 710 may be separated from the base electrode 708 by triboelectrically neutral, low electric susceptibility, and electrically non-conductive material 702 which may serve as support(s) (and/or gap(s) with no material may also be used). The electrodes 704, 706, 708, and 710 may be filled with a triboelectrically neutral, low electric susceptibility, and electrically non-conductive material. Electrical connections to the electrode elements may be made at a connector 714 at a point (a) on the base electrode 708 and made at the connectors 711 for the x-electrode 706, at connector 712 for the z-electrode 704, and at connector 713 for the y-electrode 710. Coaxial wires may connect the electrodes 704, 706, and 710 to their respective connectors, 712, 711, and 713, respectively. The connecting wires may be small diameter magnet wire, small diameter wire without insulation, or small diameter wire with electrical non-conductive insulation having neutral triboelectric properties and low electric susceptibility as to not disturbed the electric field to be measured. Connections may be made from connectors 714, 712, 711, and 713 to FET gates. For example, a FET gate associated with the base electrode 708 may be connected to the connector 714, a FET gate associated with the x-electrode 706 may be connected to the connector 711, a FET gate associated with the y-electrode 710 may be connected to the connector 713, and a FET gate associated with the z-electrode 704 may be connected to the connector 712.

Differencing the electrical potential, at a time τ, between the electrode along the x-direction 706 and the base electrode 708 and dividing by the fixed distance along the X-direction, ΔX', yields the X component of the electric field at point X, Y, and Z as a function of time, as follows:

$$\vec{E_X}(X(\tau), Y(\tau), Z(\tau), \tau) = -\left(\frac{\Delta V_{a,x}(\Delta X', \tau)}{\Delta X'}\right)\hat{i}$$

where $\Delta V_{a,x}(\Delta X', \tau)$ is the electrical potential difference between the electrode along the x-direction 706 and the base electrode 708 at point a.

Differencing the electrical potential, at a time τ, between the electrode along the y-direction 710 and the base electrode 708 and dividing by the fixed distance along the Y-direction, ΔY', yields the Y component of the electric field at point X, Y, and Z as a function of time, as follows:

$$\vec{E_Y}(X(\tau), Y(\tau), Z(\tau), \tau) = -\left(\frac{\Delta V_{a,y}(\Delta Y', \tau)}{\Delta Y'}\right)\hat{j}$$

where $\Delta V_{a,y}(\Delta Y', \tau)$ is the electrical potential difference between the electrode along the y-direction 710 and the base electrode 708 at point a.

Differencing the electrical potential, at a time τ, between the electrode along the z-direction 704 and the base electrode 708 and dividing by the fixed distance along the Z-direction, ΔZ', yields the Z component of the electric field at point X, Y, and Z as a function of time, as follows:

$$\vec{E_Z}(X(\tau), Y(\tau), Z(\tau), \tau) = -\left(\frac{\Delta V_{a,z}(\Delta Z', \tau)}{\Delta Z'}\right)\hat{k}$$

where $\Delta V_{a,z}(\Delta Z', \tau)$ is the electrical potential difference between the electrode along the z-direction 704 and the base electrode 708 at point a.

Combining the X, Y, and Z electric field components yields the electric field at any point X, Y, and Z as a function of time, as follows:

$$\vec{E}(X(\tau), Y(\tau), Z(\tau), \tau) = -$$
$$\left[\left(\frac{\Delta V_{a,x}(\Delta X', \tau)}{\Delta X'}\right)\hat{i} + \left(\frac{\Delta V_{a,y}(\Delta Y', \tau)}{\Delta Y'}\right)\hat{j} + \left(\frac{\Delta V_{a,z}(\Delta Z', \tau)}{\Delta Z'}\right)\hat{k}\right].$$

In various embodiments, other multi-element electrode configurations may be used, for example, more than two elements may be on any axis to simultaneously measure the change in electric field as a function of distance along an axis.

Figure 9:
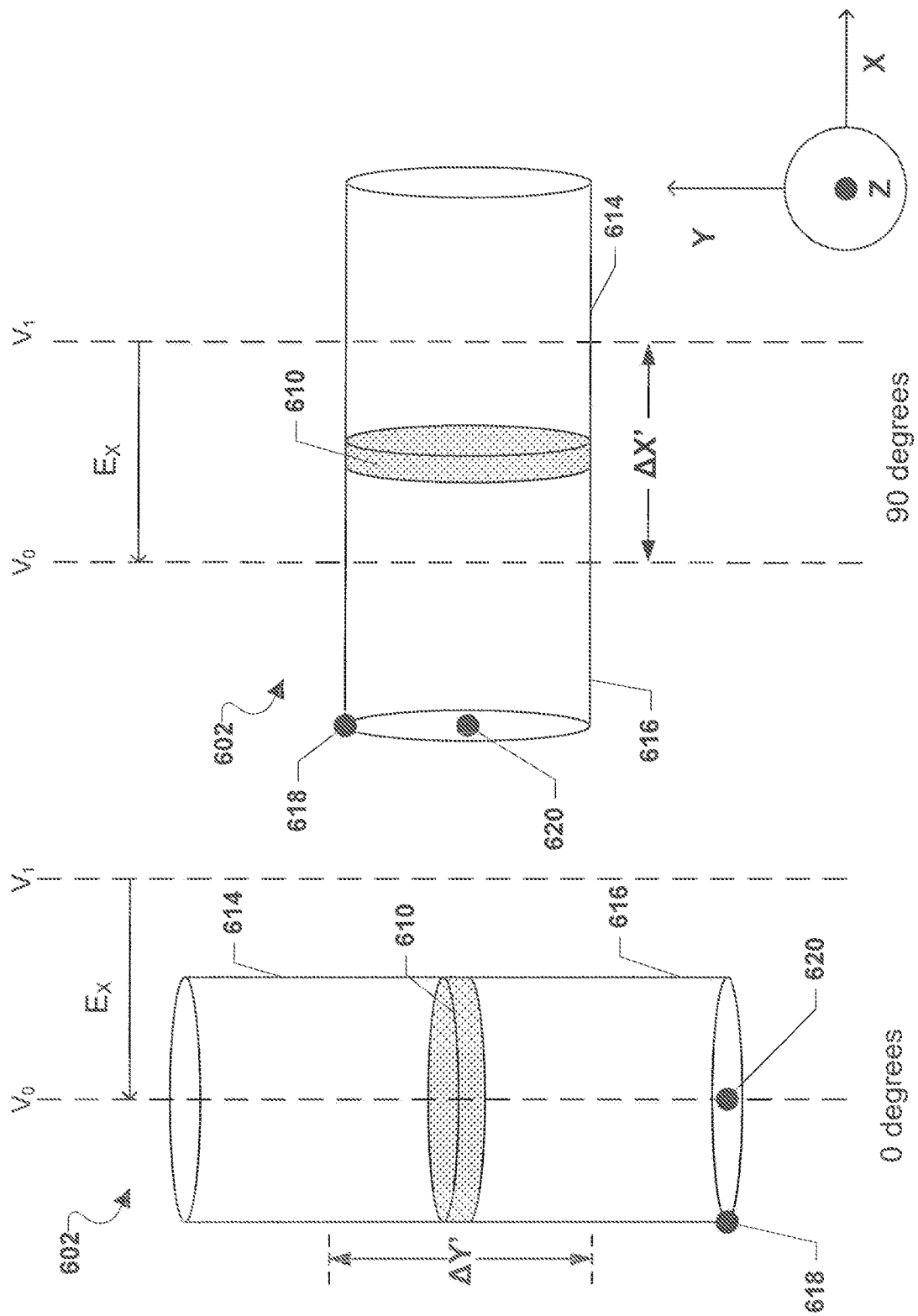
FIG. 9 illustrates a method for determining a location of an object emanating an electric field using a dual electrode style sensor of FIG. 6, consistent with one or more embodiments of the present disclosure.

Multi-element electrodes have an added benefit, that a single multi-element electrode may be rotated to measure the electric field components in three orthogonal directions determining the electric field at a point X, Y, and Z at a at a time τ time. The location of the object emanating the electric field may be determined with a minimum of sensors. An illustrative example is shown in FIG. 9 using the dual electrode style sensor 602 shown in FIG. 6. When the dual element electrode 602 is oriented along the Y direction and along an equipotential line $V_0$, electrode 618 and electrode 620 may be at the same measured potential $V_0$ such that there may be no electric field component along the Y direction, as shown by the following:

$$\vec{E_Y}(X(\tau), Y(\tau), Z(\tau), \tau) = -\left(\frac{\Delta V_y(\Delta Y', \tau)}{\Delta Y'}\right)\hat{j} = 0.$$

In contrast, when the same electrode 602 is rotated 90 degrees around the Z axis, electrode 618 and electrode 620 may be at the measured at potential $V_0$ and $V_1$, respectively, such that there is a non-zero electric field component along the X direction, $$\vec{E_X}(X(\tau), Y(\tau), Z(\tau), \tau) = -\left(\frac{\Delta V_x(\Delta X', \tau)}{\Delta X'}\right)\hat{i}$$

identifying object location along the X direction.

Figure 10:
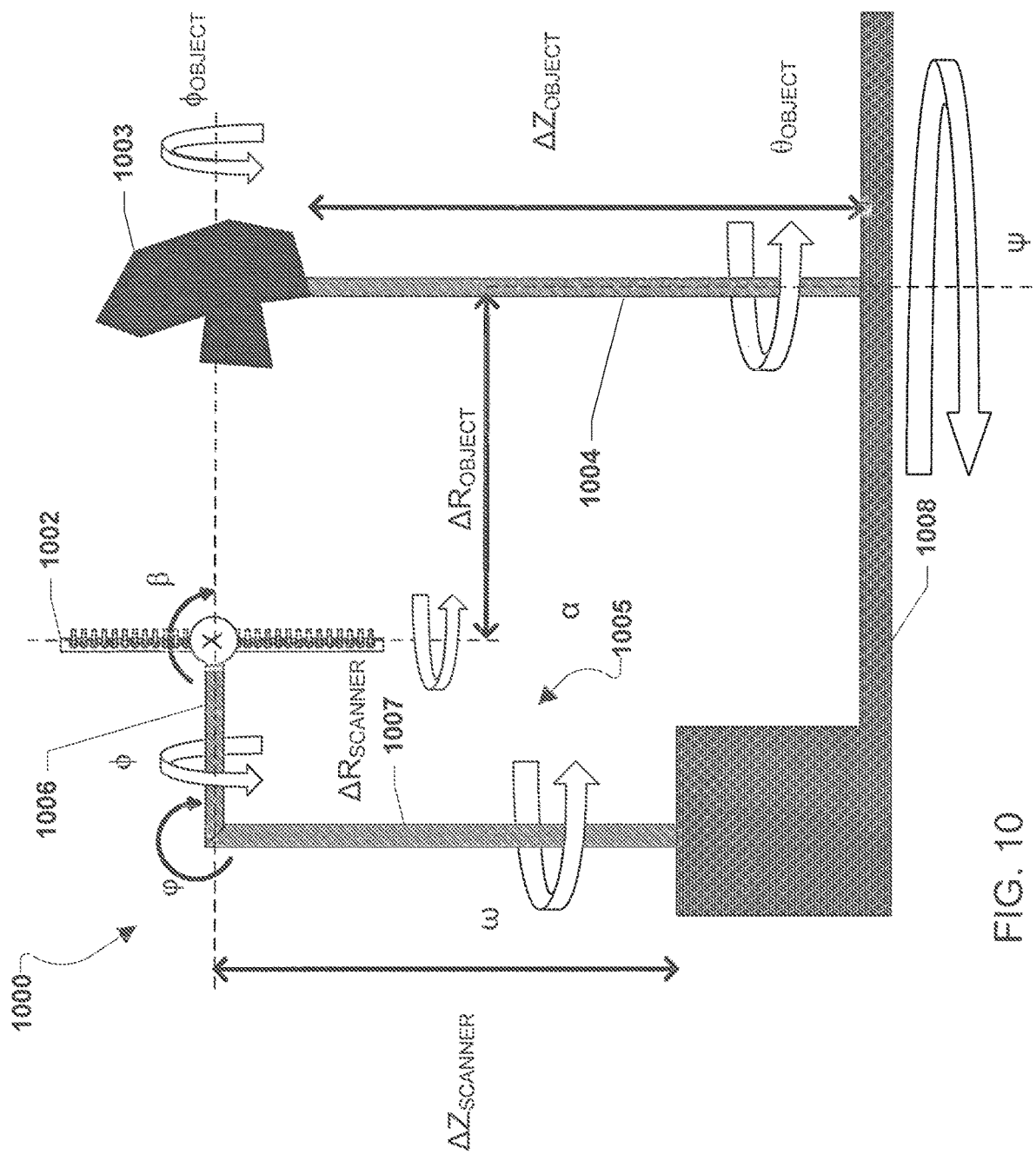
FIG. 10 is a component block diagram illustrating a dynamic multidimensional electric potential and electric field quantitative measurement system, consistent with one or more embodiments of the present disclosure.

FIG. 10 illustrates a dynamic multidimensional electric potential and electric field quantitative measurement system 1000 according to an embodiment. System 100 may include a sensor array 1002, such as sensor arrays 107 and 402 described above, which may be used for both 2D and three dimensional (3D) imaging of electric potential and electric fields in a computed tomography fashion. The system 100 may further include a scanner support 1005 with arms 1006 and 1007, as well as an object support 1004 supporting an object 1003 (or volume) of interest. The object support 1004 and scanner support 1005 may be coupled to a base 1008. In various embodiments, the sensor array 1002 may be moved to scan objects (or volumes) 1003 of interest, the object 1003 may be moved while the sensor array 1003 is fixed, or both the object 1003 and sensor array 1002 may be move simultaneously as shown in FIG. 10. In the configuration shown in FIG. 10, the sensor array 1002 may be articulated and rotated though angles α, β, ϕ, φ, ω by movement (e.g., rotation, extension, etc.) of the arms 1006 and/or 1007 and the object 1003 may be rotated about the angle ψ around the object support 1004 by rotation of the support 1004. The base 1008 and/or arms 1006 and 1007 and/or object support 1004 may move such that there is a variable radial displacement $\Delta R_{SCANNER}$ and variable height $\Delta Z_{OBJECT}$. In contrast, the scanner may be held fixed without rotation and the object 1003 of interest may be moved at variable distance $\Delta R_{OBJECT}$ that is rotated through azimuthal angle $\theta_{OBJECT}$ and polar elevation angle $\phi_{OBJECT}$ at a variable height $\Delta Z_{OBJECT}$. Other movement configurations may also be used in the various embodiments. A reference electric field may be applied to "illuminate" objects of interest in a known electric field.

Figure 11A:
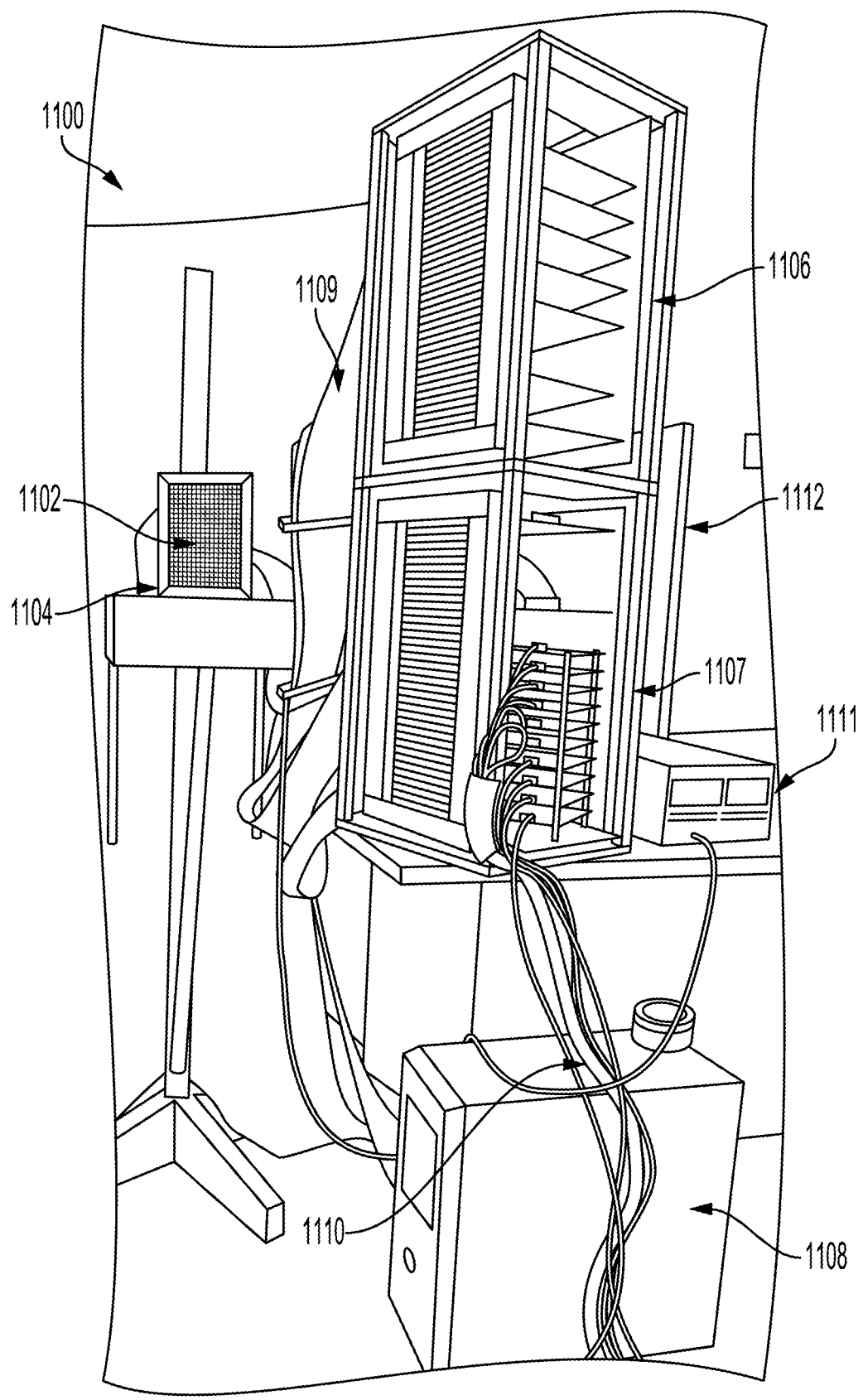
FIG. 11A illustrates an operational 2D electric potential and electric field imaging system, consistent with one or more embodiments of the present disclosure.
Figure 11B:
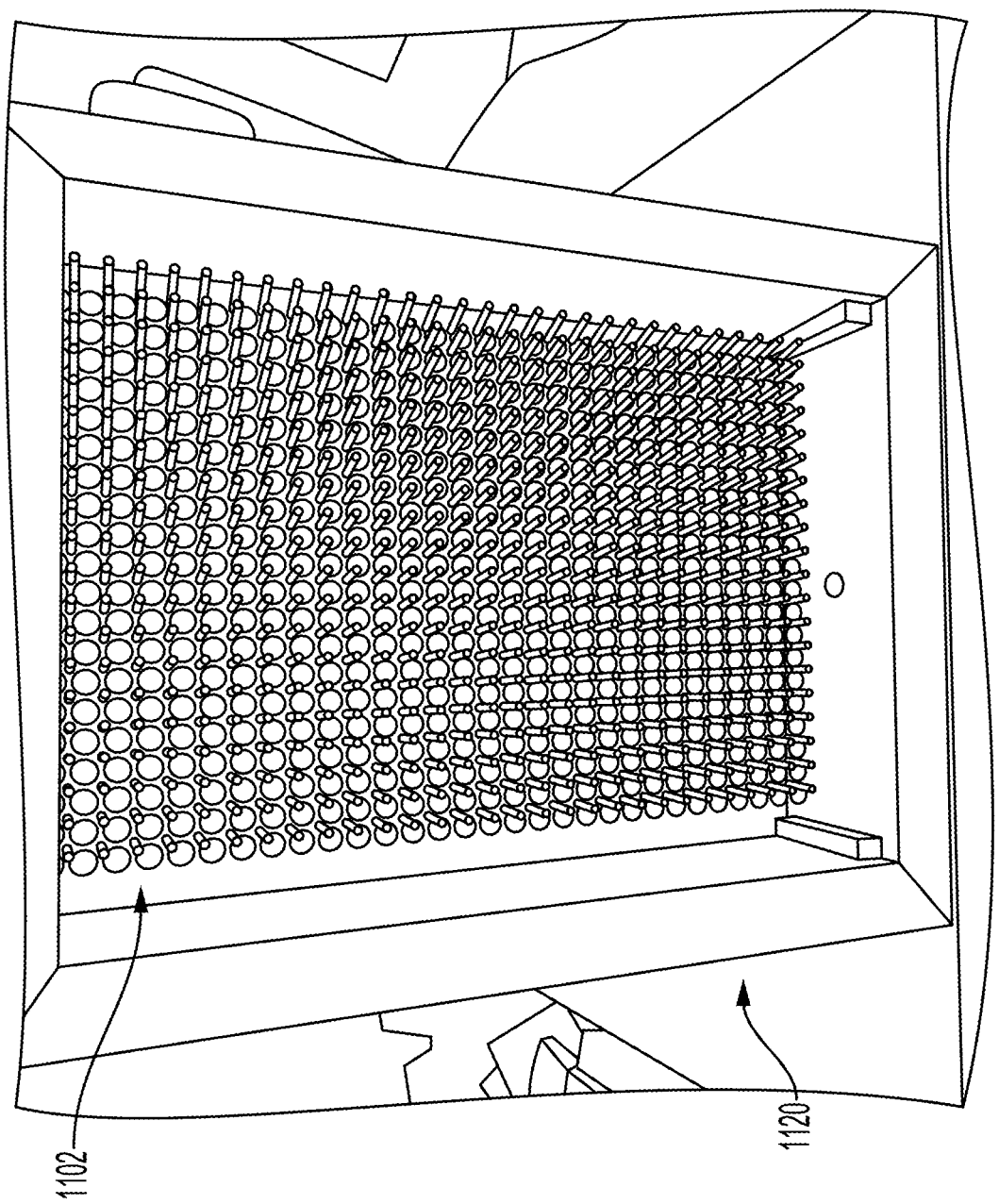
FIG. 11B illustrates a 2D sensor array in a casing, consistent with one or more embodiments of the present disclosure.
Figure 11C:
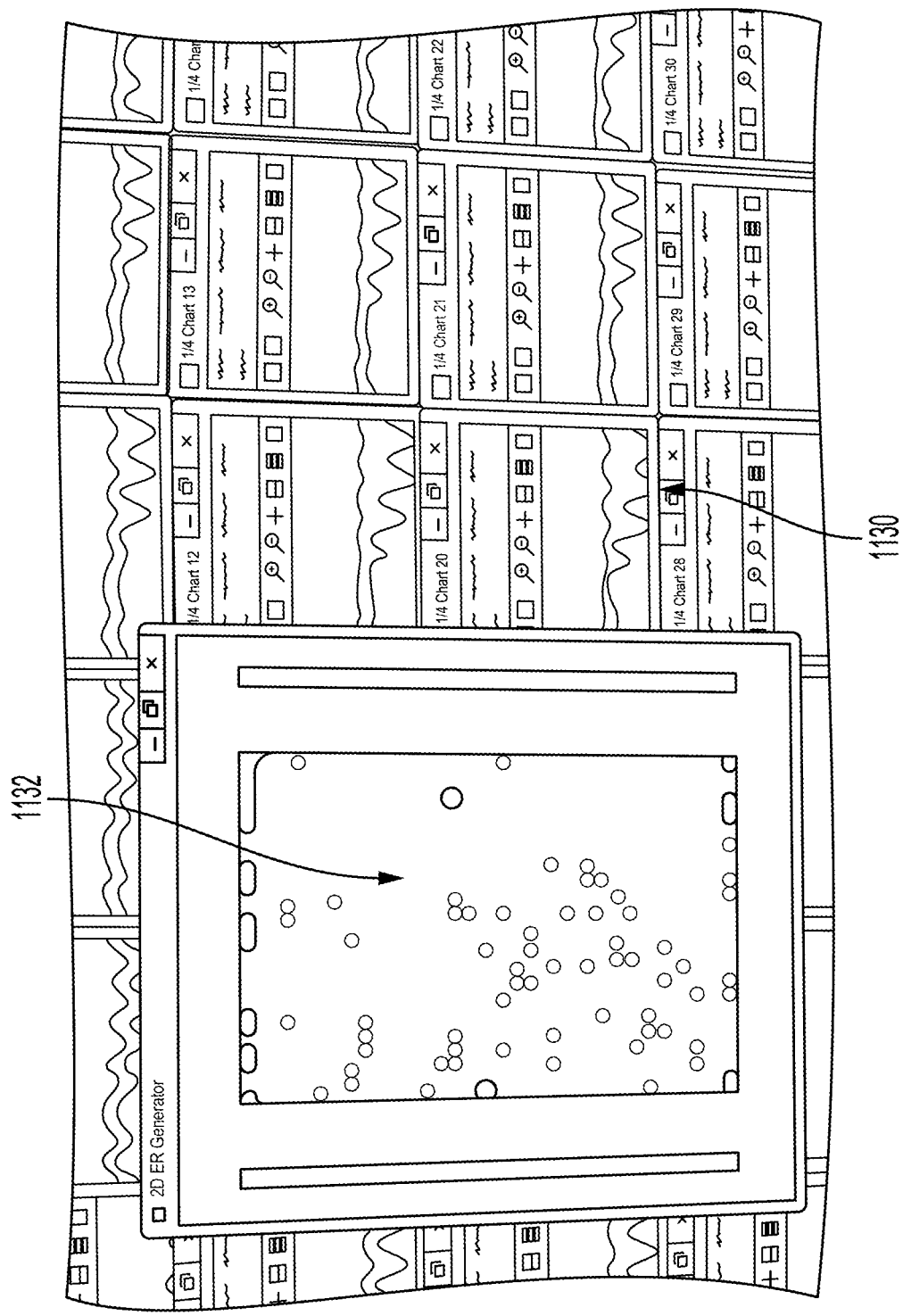
FIG. 11C illustrates simultaneous voltage measurement data (waveforms) from various FETs of a 2D sensor and an image of the electric potential measured, as an image linear gray scale, at the 2D array location, consistent with one or more embodiments of the present disclosure.

FIG. 11A illustrates an operational 2D electric potential and electric field imaging system 1100 including a 2D sensor array 1102, triboelectrically neutral, low electrical susceptibility, non-conductive casing and supporting components 1104, precision interface circuit 1106, sampling circuit 1107 (e.g., a 600 channel DAQ board), a processing circuit 1108, measurement cables 1109, precision power supply 1111, power cables and sampling circuit control cables 1110, and a visual display 1112. The 2D sensor array 1102 in a suitable casing 1120 is shown in FIG. 11B. FIG. 11C shows the simultaneous voltage measurement data (waveforms) from all the FETs in the sensing array as a function of time on the visual display 1130 and a two-dimensional linear grey scale image 1132 of the electrical potential measured over the two dimensional area of the sensing array 1102. The electrical potential image is at one point in time. The visual output may be in real-time depending on the acquisition rate and processing circuit 1108 capabilities. The video display may be used to present the electric potential and the field, $\vec{E}=\vec{E}_x+\vec{E}_y+\vec{E}_z$, electric field components $\vec{E}_x$, $\vec{E}_y$, $\vec{E}_z$, and the magnitude of the electric field, $|\vec{E}|$ as a function of spatial location and time.

Figure 13:
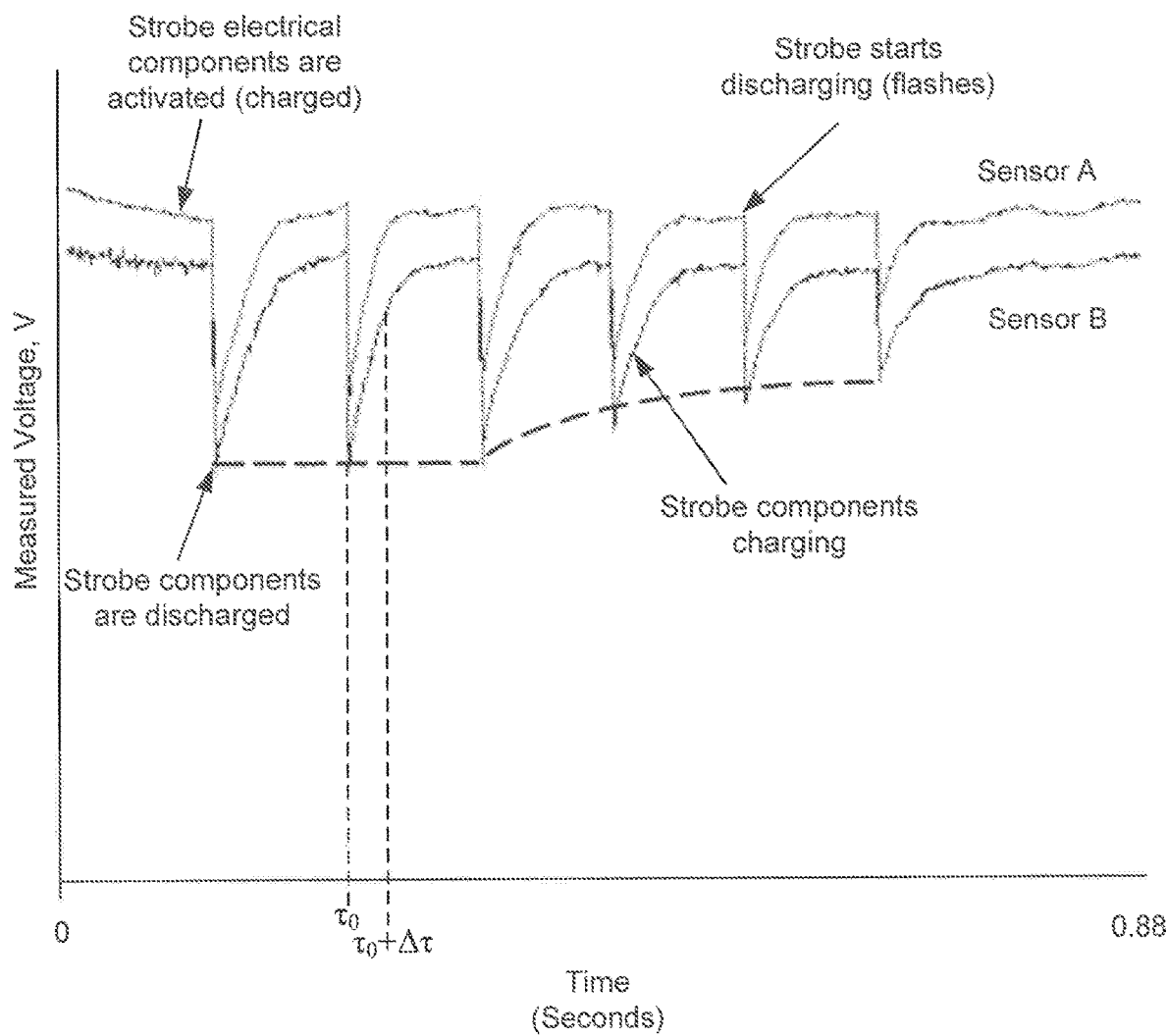
FIG. 13 is a graph of measured voltages from the tests shown in FIG. 12, consistent with one or more embodiments of the present disclosure.

FIG. 12 illustrates a test conducted of the electric field imaging system 1100. The test object is an optical flash strobe 1201. The strobe circuitry of interest is contained in a polymer casing 1202. A cover casing 1203 was added to the sensor array 1102 to protect the gate electrode from possible handling damage. Casing 1203 was also be triboelectrically neutral, had a low electric susceptibility, and was electrically non-conductive. A protective casing may not be required for measurement and is optional during measurements. The strobe 1201 was set to activate or flash six times at 10 Hz. FIG. 13 shows the measured voltages V from FET A (sensor A) and FET B (sensor B) as a waveforms as a function of time. Each sensor was calibrated to provide a quantified measurement electrical potential at the gate electrode of each of the sensors. The individual strobe discharge times (for example, $\tau_0$), charging times, and repetition rate are directly measurable from the waveforms. A point during charging is shown at $\tau_0+\Delta\tau$. As the strobe cycles past the third repeated discharge, the discharging level varied with time. These measurements were made remotely without contact with the circuit in the polymer casing 1202.

FIG. 14 shows a visual display outputs 1202 and 1204 of electrical potential over the area of the sensor array 1102 for two different $\tau_0$ (1202) and $\tau_0+0.06$ seconds (1204). The lightest shaded areas represent an electric potential drop of −0.224 volts. The individual circuit elements and their operational function are highlighted by the change in their electrical potentials as a function of time. In this manner, electrical potential images as a function of time may be presented in real-time on the display.

It will be readily understood that the components of various embodiments of the present disclosure, as generally described and illustrated in the figures herein, may be arranged and designed in a wide variety of different configurations. Thus, the detailed description of the embodiments of the present disclosure, as represented in the attached figures, is not intended to limit the scope of the invention as claimed, but is merely representative of selected embodiments of the invention.

The features, structures, or characteristics of the present disclosure may be combined in any suitable manner in one or more embodiments. For example, reference throughout this specification to "certain embodiments," "some embodiments," or similar language means that a particular feature, structure, or characteristic described in connection with the embodiment is included in at least one embodiment. Thus, appearances of the phrases "in certain embodiments," "in some embodiment," "in other embodiments," or similar language throughout this specification do not necessarily all refer to the same group of embodiments and the described features, structures, or characteristics may be combined in any suitable manner in one or more embodiments.

It should be noted that reference throughout this specification to features, advantages, or similar language does not imply that all of the features and advantages should be or are present in any single embodiment of the invention. Rather, language referring to the features and advantages is understood to mean that a specific feature, advantage, or characteristic described in connection with an embodiment is included in at least one embodiment of the present disclosure. Thus, discussion of the features and advantages, and similar language, throughout this specification may, but do not necessarily, refer to the same embodiment. Furthermore, features, advantages, and characteristics described herein may be combined in any suitable manner in one or more embodiments. For example, although aspects and features may in some cases be described in individual figures, it will be appreciated that features from one figure can be combined with features of another figure even though the combination is not explicitly shown or explicitly described as a combination. Moreover, one skilled in the relevant art will recognize that the invention can be practiced without one or more of the specific features or advantages of a particular embodiment illustrated in the figures or described herein. In other instances, additional features and advantages may be recognized in certain embodiments that may not be present in all embodiments of the invention. One having ordinary skill in the art will readily understand that the invention as discussed above may be practiced with steps in a different order, and/or with hardware elements in configurations which are different than those which are disclosed.

Other aspects and embodiments may will be apparent from consideration of the specification. It is intended that the specification and illustrated embodiments be considered as examples only with a true scope of the invention being indicated by the following-claims.

What is claimed is:

1. A multi-dimensional electric potential sensor array, comprising:
    an array of electric potential sensors that comprise sets of triaxial electrodes, each set rotatable along one or more axis, and wherein each set of triaxial electrodes includes three electrodes separated from a base electrode, configured to be supported by a triboelectrically neutral, low electric susceptibility, and electrically non-conductive material; and
    a support casing supporting the array of electric potential sensors, wherein the support casing is triboelectrically neutral, has a low electric susceptibility, and is electrically non-conductive.

2. The array of claim 1, wherein the electric potential sensors comprise field effect transistors (FETs).

3. The array of claim 2, wherein gates of the FETs are electrically floating.

4. The array of claim 2, wherein the electric potential sensors in the array are arranged in a series of rows of electric potential sensors and a series of columns of electric potential sensors.

5. The array of claim 4, wherein the series of rows is 30 rows and the series of columns is 20 columns.

6. The array of claim 2, wherein the electric potential sensors comprise collinear electrodes coupled to respective gates of respective ones of the FETs.

7. The array of claim 1, further comprising:
    a sampling circuit configured to sample signals from the electric potential sensors; and
    a processing circuit configured to receive sampled signals from the sampling circuit and generate an electric potential electric potential sensors image based, at least in part, on the sampled signals.

8. The array of claim 7, wherein the processing circuit is remotely located with respect to the electric potential sensors.

9. The array of claim 7, wherein the sampling circuit is remotely located with respect to the electric potential sensors.

10. The array of claim 7, wherein the processing circuit is configured to generate an electric potential image based, at least in part, on the sampled signals in real-time.

11. The array of claim 8, further comprising a scanner support configured to move the electric potential sensors while the sampling circuit samples the signals.

12. The array of claim 7, further comprising:
    an interface circuit operatively coupled between the electric potential sensors and the sampling circuit, the interface circuit comprising a respective resistor for each FET and configured to convert a current to a voltage difference.

* * * * *